(12) United States Patent
Cea et al.

(10) Patent No.: US 10,886,272 B2
(45) Date of Patent: Jan. 5, 2021

(54) TECHNIQUES FOR FORMING DUAL-STRAIN FINS FOR CO-INTEGRATED N-MOS AND P-MOS DEVICES

(71) Applicant: INTEL CORPORATION, Santa Clara, CA (US)

(72) Inventors: Stephen M. Cea, Hillsboro, OR (US); Rishabh Mehandru, Portland, OR (US); Anupama Bowonder, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/465,039

(22) PCT Filed: Dec. 29, 2016

(86) PCT No.: PCT/US2016/069126
§ 371 (c)(1),
(2) Date: May 29, 2019

(87) PCT Pub. No.: WO2018/125120
PCT Pub. Date: Jul. 5, 2018

(65) Prior Publication Data
US 2019/0326290 A1   Oct. 24, 2019

(51) Int. Cl.
*H01L 29/165*   (2006.01)
*H01L 29/78*   (2006.01)
(Continued)

(52) U.S. Cl.
CPC .... *H01L 27/0924* (2013.01); *H01L 21/02532* (2013.01); *H01L 21/823821* (2013.01);
(Continued)

(58) Field of Classification Search
CPC ....... H01L 29/66; H01L 29/165; H01L 29/78; H01L 21/02532; H01L 27/0924
(Continued)

(56) References Cited

U.S. PATENT DOCUMENTS 9,224,808 B2   12/2015  Cea et al.
9,935,107 B2    4/2018  Cea et al.
(Continued)

FOREIGN PATENT DOCUMENTS

WO       2018125120 A1    7/2018

OTHER PUBLICATIONS

International Search Report and Written Opinion received for PCT/US2016/069126, dated Sep. 19, 2017. 10 pages.
(Continued)

*Primary Examiner* — Fazli Erdem
(74) *Attorney, Agent, or Firm* — Finch & Maloney PLLC

(57) ABSTRACT

Techniques are disclosed for forming dual-strain fins for co-integrated n-MOS and p-MOS devices. The techniques can be used to monolithically form tensile-strained fins to be used for n-MOS devices and compressive-strained fins to be used for p-MOS devices utilizing the same substrate, such that a single integrated circuit (IC) can include both of the devices. In some instances, the oppositely stressed fins may be achieved by employing a relaxed SiGe (rSiGe) layer from which the tensile and compressive-strained material can be formed. In some instances, the techniques include the formation of tensile-stressed Si and/or SiGe fins and compressive-stressed SiGe and/or Ge fins using a single relaxed SiGe layer to enable the co-integration of n-MOS and p-MOS devices, where each set of devices includes preferred materials and preferred stress/strain to enhance their respective performance. In some cases, improvements of at least 25% in drive current can be obtained.

20 Claims, 23 Drawing Sheets

(51) Int. Cl.
   *H01L 29/66*      (2006.01)
   *H01L 27/092*     (2006.01)
   *H01L 21/02*      (2006.01)
   *H01L 21/8238*    (2006.01)
   *H01L 29/06*      (2006.01)

(52) U.S. Cl.
   CPC .. *H01L 21/823878* (2013.01); *H01L 29/0673* (2013.01); *H01L 29/165* (2013.01); *H01L 29/66545* (2013.01); *H01L 29/66795* (2013.01); *H01L 29/785* (2013.01)

(58) Field of Classification Search
   USPC .......................................................... 257/369
   See application file for complete search history.

(56) References Cited

U.S. PATENT DOCUMENTS

| | | |
|---|---|---|
| 2008/0191281 A1 | 8/2008 | Chidambarrao et al. |
| 2012/0261757 A1 | 10/2012 | Doris et al. |
| 2016/0104799 A1* | 4/2016 | Qi ...................... H01L 29/1054 257/29 |
| 2016/0276347 A1* | 9/2016 | Cea .................... H01L 29/1054 |
| 2016/0358922 A1 | 12/2016 | Cheng et al. |
| 2017/0125551 A1* | 5/2017 | Cheng ............. H01L 21/823821 |
| 2017/0358677 A1* | 12/2017 | Cheng .................. H01L 29/785 |

OTHER PUBLICATIONS

International Preliminary Report on Patentability received for PCT/US2016/069126, dated Jul. 2, 2019. 9 pages.

* cited by examiner

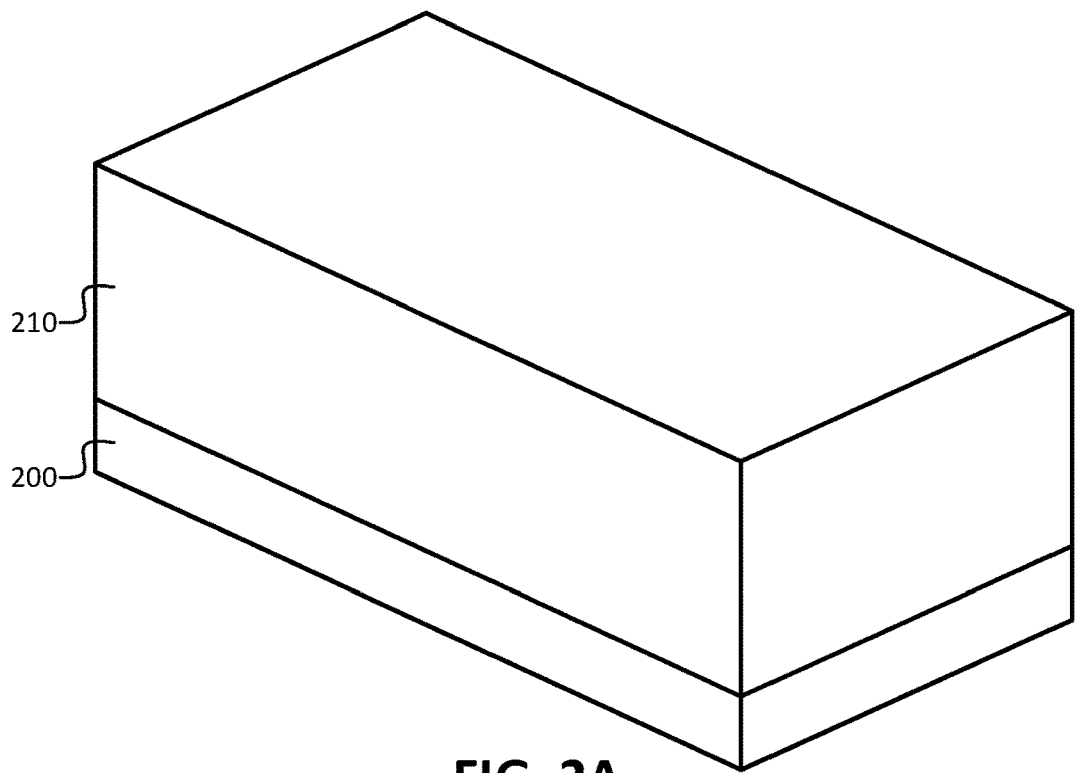
FIG. 2A
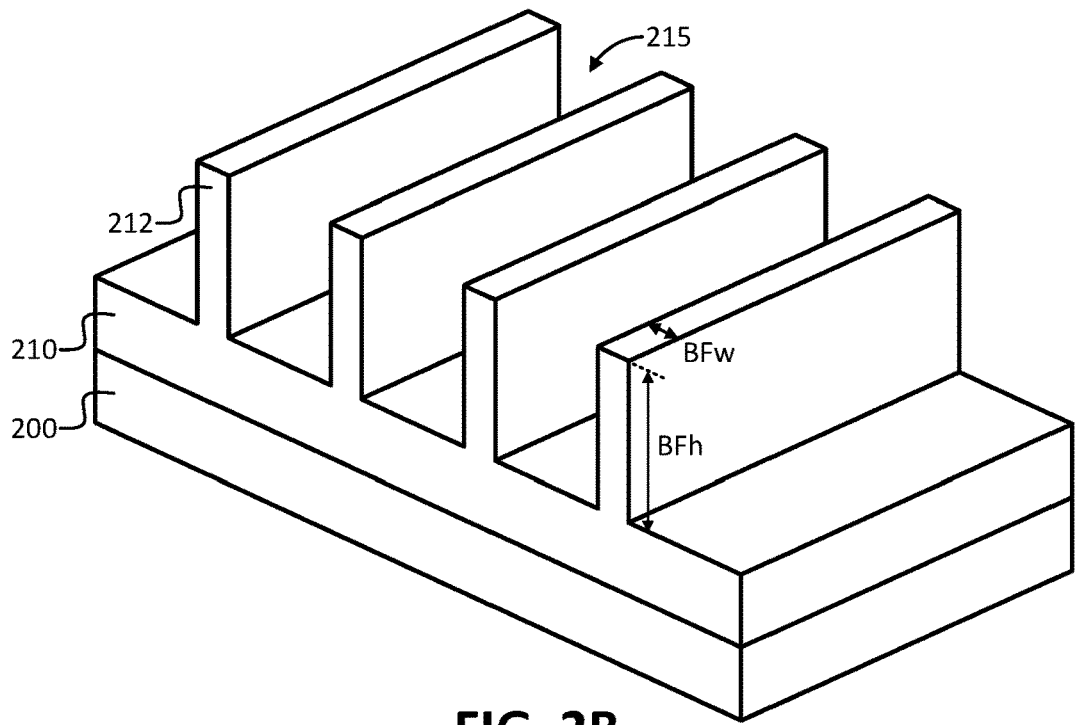
FIG. 2B
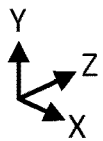

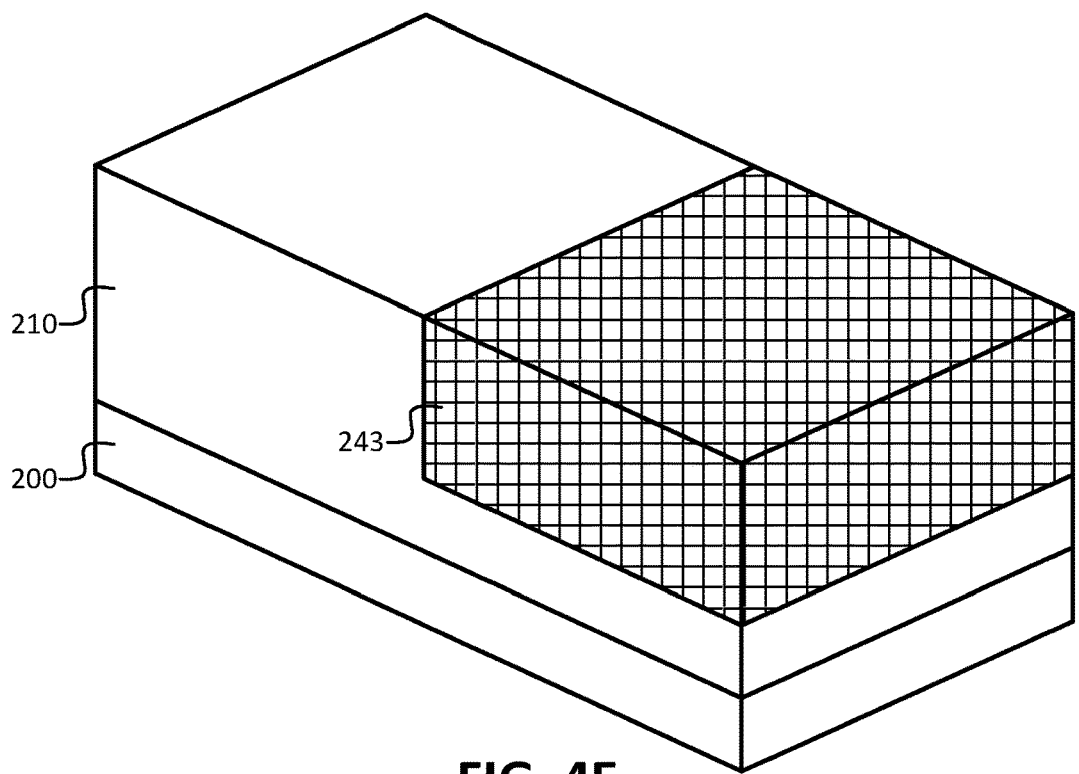
FIG. 4E
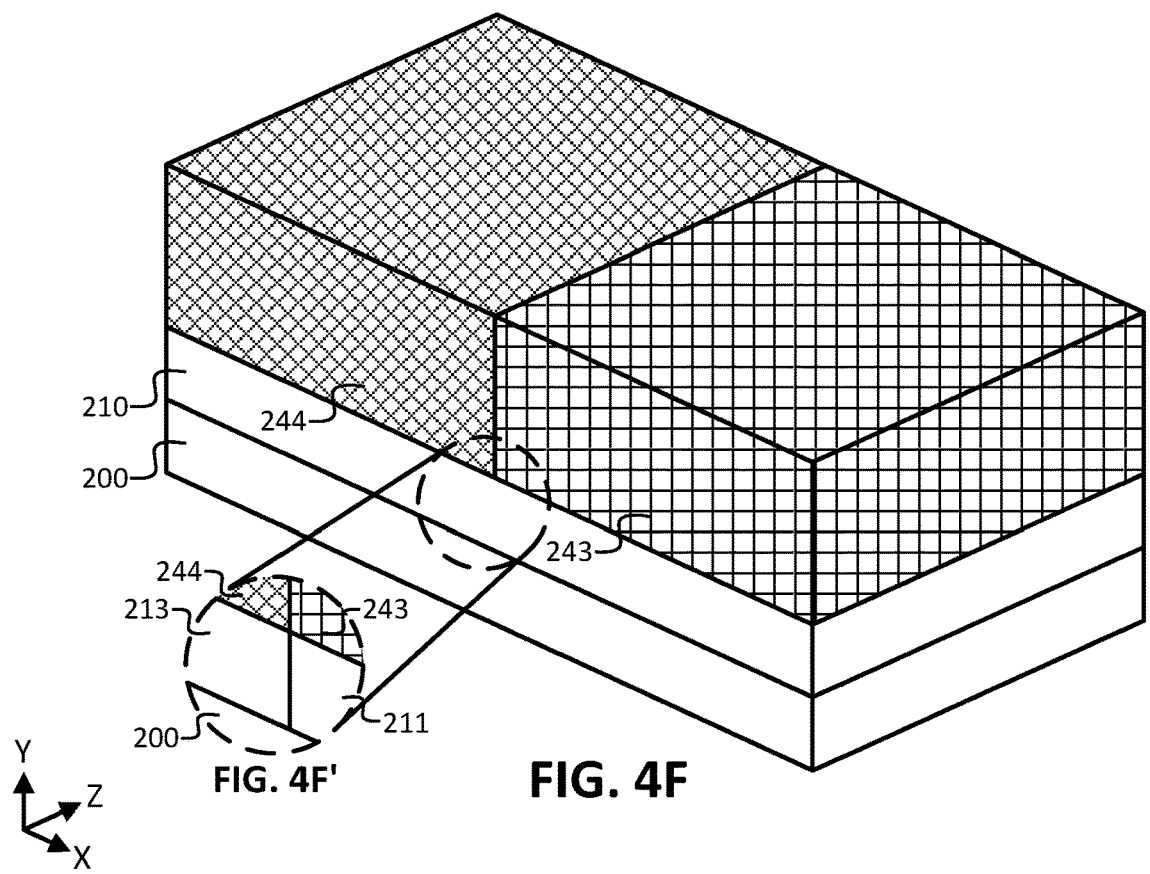
FIG. 4F'  FIG. 4F

TECHNIQUES FOR FORMING DUAL-STRAIN FINS FOR CO-INTEGRATED N-MOS AND P-MOS DEVICES

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric layer between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-H illustrate example IC structures formed when carrying out the method of FIG. 1A, specifically up to the point that dual-strained fins have been formed, in accordance with some embodiments.

FIG. 2H' illustrates a blown-out portion of FIG. 2H to illustrate variations with respect to the techniques for dual-strained fins as described herein, in accordance with some embodiments.

FIGS. 4A-H illustrate example IC structures formed when carrying out the method of FIG. 1C, specifically up to the point that dual-strained fins have been formed, in accordance with some embodiments.

FIG. 4F' illustrates a blown-out portion of FIG. 4F to illustrate variations with respect to the techniques for forming dual-strained fins as described herein, in accordance with some embodiments.

Figure 1A:
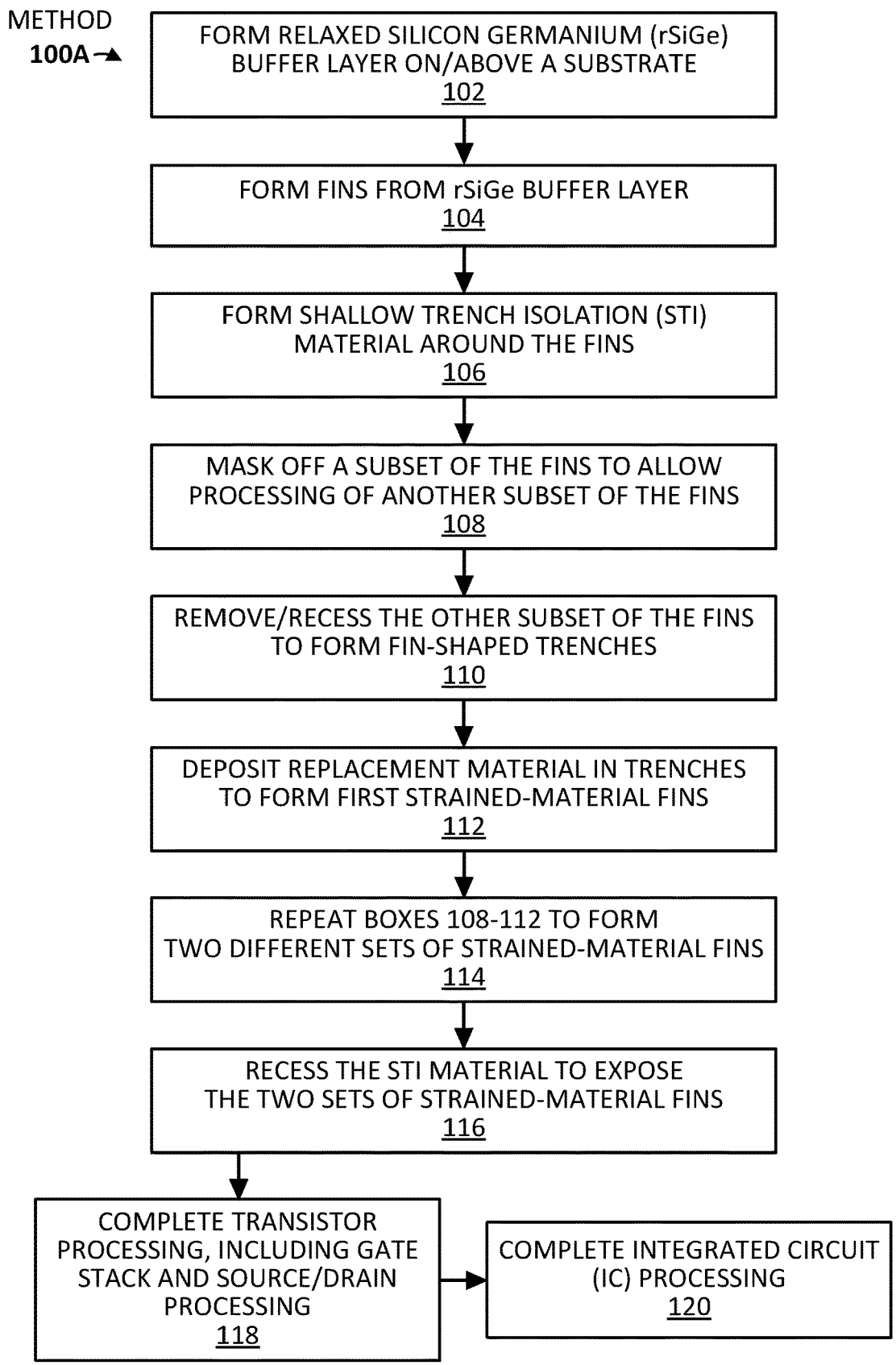
FIGS. 1A-D illustrate methods of forming an integrated circuit (IC) including dual-strain fins for co-integrated n-MOS and p-MOS devices, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

With the semiconductor industry utilizing CMOS circuitry for a multitude of applications, where CMOS circuitry includes both n-MOS and p-MOS devices, various issues arise in the co-integration of n-MOS and p-MOS devices. For instance, when monolithically integrating n-MOS and p-MOS devices using the same substrate, forming high performance versions of both devices can be difficult. In general, an example performance enhancement for MOS devices is to introduce stress in the channel region. However, it is difficult to obtain the desired stress for both n-MOS and p-MOS devices when they are co-integrated, particularly when the transistor devices being formed are scaled down to relatively small critical dimensions (e.g., where gate lengths are sub-30 nm). One example difficulty in the co-integration is a result of n-MOS devices and p-MOS devices generally performing better using different materials for the different devices (e.g., silicon (Si) or low-content germanium (Ge) silicon germanium (SiGe) is preferred for n-MOS devices and high-content SiGe or Ge is preferred for p-MOS devices). Further, another difficulty in the co-integration (and achieving the desired stress for both devices) is due to n-MOS devices performing better with increased tensile stress in the channel region and p-MOS devices performing better with increased compressive strain in the channel region.

Thus, and in accordance with one or more embodiments of the present disclosure, techniques are provided for forming dual-strain fins for co-integrated n-MOS and p-MOS devices. In some embodiments, the techniques can be used to monolithically form tensile-strained fins to be used for n-MOS devices and compressive-strained fins to be used for p-MOS devices utilizing the same substrate, such that a single integrated circuit (IC) can include both of the devices. In some such embodiments, the oppositely stressed fins may be achieved by employing a relaxed SiGe (rSiGe) layer from which the tensile and compressive-strained material can be formed. Because the SiGe layer is relaxed (e.g., as a result of it being formed as a metamorphic layer, such that it has a thickness exceeding its strain relaxation critical thickness), the atomic percentage of Ge content (the Ge concentration) included in the rSiGe material determines the lattice constant of the material. As can be understood based on this disclosure, if Si and/or SiGe material with relatively lower Ge content (relative to the rSiGe layer) is grown on the rSiGe layer, and the grown material includes a pseudomorphic thickness (i.e., a thickness less than the strain relaxation critical thickness of the material), the Si/SiGe material will be tensile strained to the rSiGe layer, thereby enabling the formation of tensile-stressed Si/SiGe fins that can be used to form one or more n-MOS devices. As can also be understood based on this disclosure, if SiGe with relatively higher Ge content (relative to the rSiGe layer) and/or Ge is grown on the rSiGe layer, and the grown material includes a pseudomorphic thickness (i.e., a thickness less than the strain relaxation critical thickness of the material), the SiGe/Ge material will be compressive strained to the rSiGe layer, thereby enabling the formation of compressive-stressed SiGe/Ge fins that can be used to form one or more p-MOS devices. Therefore, in some embodiments, the techniques described herein, include the formation of tensile-stressed Si and/or SiGe fins and compressive-stressed SiGe and/or Ge fins using a single rSiGe layer to enable the co-integration of n-MOS and p-MOS devices, where each set of devices includes preferred materials and preferred stress/strain to enhance their respective performance.

As will be apparent in light of this disclosure, there are a multitude of techniques described herein for forming tensile-strained fins and compressive-strained fins using the same substrate. For instance, in some embodiments, the techniques may include forming a relaxed SiGe (rSiGe) buffer layer on a substrate (e.g., a Si substrate), forming fins from the rSiGe buffer layer, forming shallow trench isolation (STI) material around the fins, masking off a subset of the fins (e.g., fins to be used for either n-MOS or p-MOS devices) to allow processing of another subset of the fins (e.g., fins to be used for the other of n-MOS or p-MOS devices), removing or recessing the other subset of fins to form fin-shaped trenches, depositing replacement material in the trenches to form first strained material fins, repeating the replacement fin processing to form a second strained material fins (e.g., repeating the masking, removing/recessing, and replacing processes), and then recessing the STI material to expose the two sets of strained material fins, where one of the first and second strained material fins is tensile strained and the other is compressive strained, thereby producing dual-strain fins to be used in the formation of co-integrated n-MOS and p-MOS devices. Other techniques will be apparent in light of this disclosure, in accordance with some embodiments, where the techniques produce at least two sets of fins, such that there is at least one set of one or more tensile-strained fins (e.g., for use in one or more n-MOS devices) and at least one set of one or more compressive-strained fins (e.g., for use in one or more p-MOS devices).

Other such techniques of forming dual-strained fins may include, in some embodiments, forming a rSiGe buffer layer on a substrate (e.g., a Si substrate), forming a first strained material layer on the rSiGe buffer layer, forming fins from the first strained material to form a first set of strained material fins, forming STI material around the fins, masking off a subset of the fins to allow processing of another subset of the fins, removing or recessing the other subset of fins to form fin-shaped trenches, depositing replacement material in the trenches to form a second set of strained material fins, recessing the STI material to expose the two sets of strained material fins (where one of the first and second strained material fins is tensile strained and the other is compressive strained), and completing the formation of co-integrated n-MOS and p-MOS devices. Further, in some embodiments, the techniques of forming dual-strained fins may include forming a rSiGe buffer layer on a substrate (e.g., a Si substrate), forming a first strained material layer on the rSiGe buffer layer, forming a second strained material layer on the rSiGe buffer layer (e.g., in a dual-well approach), forming fins from the first and second strained material layers, forming STI material around the fins, recessing the STI material to expose the two sets of strained material fins (where one of the first and second strained material fins is tensile strained and the other is compressive strained), and completing the formation of co-integrated n-MOS and p-MOS devices. In some embodiments, for the aforementioned techniques, the rSiGe buffer layer would be present between the substrate and the n-MOS/p-MOS devices, as can be understood based on this disclosure. However, in some embodiments, two different rSiGe buffer layers may be used, such that the resulting IC includes a first rSiGe buffer layer between the substrate and the n-MOS device(s) and a second rSiGe buffer layer between the substrate and the p-MOS device(s).

Further still, in some embodiments, the techniques of forming dual-strained fins may include forming a layer of one of the tensile and compressive-strained materials on a transfer wafer employing a rSiGe layer, bonding that layer to a host wafer (e.g., a Si wafer or an SOI wafer) and removing the rSiGe layer, forming fins from that transfer layer, masking off a subset of the fins (to maintain the original material/stress), converting a subset of the fins to the other of tensile and compressive-strained material (e.g., using a cladding and condensation process described herein), forming STI material around the fins such that two sets of strained material fins exude from the STI material (where one of the first and second strained material fins is tensile strained and the other is compressive strained), and completing the formation of co-integrated n-MOS and p-MOS devices. In some such embodiments, the rSiGe buffer layer is not present in the resulting IC, as it was merely used to form the first strained material layer that was transferred to a host wafer. Numerous variations on the techniques of forming dual-strained fins will be apparent in light of this disclosure.

In some embodiments, the difference in Ge concentration (by atomic percentage) between the rSiGe layer and the strained layer formed thereon can determine the amount and type of stress caused in the strained layer. For example, forming a Si layer or SiGe layer (with relatively lower Ge concentration/atomic percentage) on the rSiGe layer results in that Si/SiGe layer being strained with tensile stress (as long as the Si/SiGe layer is formed with a thickness below the strain relaxation critical thickness of the material), where the amount of tensile stress is approximately 0.6 gigapascals (GPa) per 10% Ge concentration difference between the rSiGe layer and the overlying Si/SiGe layer. For instance, if Si is formed on a rSiGe layer with 30% Ge concentration (which may be expressed as $rSi_{1-x}Ge_x$, where x would be 0.3, in this example case), then the 30% lesser Ge concentration in the Si layer relative to the $rSi_{0.7}Ge_{0.3}$ layer would result in the Si layer (which may also be expressed as $Si_1Ge_0$) including tensile stress of approximately 1.8-1.9 GPa. Further, if forming a SiGe layer (with relatively higher Ge concentration/atomic percentage) or Ge layer on the rSiGe layer, the SiGe/Ge layer would be strained with compressive stress (as long as the SiGe/Ge layer is formed with a thickness below the strain relaxation critical thickness of the material), where the amount of compressive stress is approximately 0.6 GPa per 10% Ge concentration difference between the rSiGe layer and the overlying SiGe/Ge layer. For instance, continuing with the same $rSi_{0.7}Ge_{0.3}$ layer example, if a layer of $Si_{0.4}Ge_{0.6}$ is formed thereon, then the 30% greater Ge concentration in the $Si_{0.4}Ge_{0.6}$ layer relative to the $rSi_{0.7}Ge_{0.3}$ layer would result in the $Si_{0.4}Ge_{0.6}$ layer including compressive stress of approximately 1.8-1.9 GPa. Thus, in some embodiments, the tensile and compressive-strained fins may each include corresponding stresses in the range of 0.5-6 GPa (e.g., 0.5-2, 0.5-4, 1-2, 1-3, 1-4, 1-5, 1-6, 1.5-3, or 1.5-6 GPa), or any other suitable value or range as will be apparent in light of this disclosure.

In some embodiments, the difference in Ge concentration (by atomic percentage) between the rSiGe layer and the overlying strained material layer (whether the overlying layer is tensile strained and includes a lower Ge concentration or whether the overlying layer is compressive strained and includes a higher Ge concentration) may be in the range of 10-90% different Ge concentration (e.g., in the subrange of 10-30, 10-50, 10-70, 20-40, 20-60, 20-80, 30-50, 30-70, 30-90, 40-60, 40-80, 50-70, 50-90, 60-80, or 70-90% or a Ge concentration difference of at least 10, 15, 20, 25, 30, 35, 40, 45, 50, 60, 70, or 80%), or some other suitable value, threshold value, or range, as will be apparent in light of this disclosure. Also note that in some such embodiments, the difference in Ge concentration relative to the rSiGe layer for the tensile-strained and compressive-strained fins need not be the same, such as forming tensile-strained $Si_{0.9}Ge_{0.1}$ fins and compressive-strained $Si_{0.4}Ge_{0.6}$ fins using a $rSi_{0.7}Ge_{0.3}$ buffer layer, for example. In some embodiments, it may be desired to have the dual-strained fins include stress amounts of at least 1 GPa, such as having the Ge concentration differences in both sets of fins be at least 20% (e.g., where the tensile strained fins include at least 20% less Ge concentration than the rSiGe layer and the compressive strained fins include at least 20% more Ge concentration than the rSiGe layer). In general, in some embodiments, the rSiGe layer may include a Ge concentration in the range of 10-90% (e.g., in the subrange of 10-30, 10-50, 10-70, 20-40, 20-60, 20-80, 30-50, 30-70, 30-90, 40-60, 40-80, 50-70, 50-90, 60-80, or 70-90% Ge concentration), the tensile-strained fins may include Si or SiGe with a Ge concentration in the range of 0-80% (e.g., in the subrange of 0-20, 0-40, 0-60, 10-50, 10-80, 20-40, 20-60, 20-80, 40-60, 40-80, or 60-80%), and the compressive-strained fins may include Ge or SiGe with a Ge concentration in the range of 20-100% (e.g., in the subrange of 20-40, 20-60, 20-80, 40-60, 40-80, 40-100, 50-70, 50-100, 60-80, 60-100, or 80-100%), or some other suitable value or range for any of the three materials as will be apparent in light of this disclosure. Numerous material variations and configurations will be apparent in light of this disclosure.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including at least one tensile-strained n-MOS device co-integrated with at least one compressive-strained p-MOS device, such both of the devices are monolithically formed using and above the same substrate. In some such embodiments, a rSiGe layer may be present between the substrate and the n-MOS device as well as being present between the substrate and the p-MOS device. Note that the stresses (whether tensile, compressive, or relaxed/not stressed) of the various IC features may be detected using, for example, electron microscopy techniques (e.g., TEM).

In some embodiments, use of the techniques and/or structures described herein may be detected based on the benefits derived therefrom, such as based on the increase in drive current for co-integrated tensile-stressed n-MOS and compressive-stressed p-MOS devices. For instance, in the example case of using 30% different Ge concentrations for both fin sets to achieve approximately 1.8-1.9 GPa of stress in both the tensile-strained fin set and the compressive-strained fin set (as described above), an improvement of over 25% in drive current at both 0.6 and 1.3 V can be achieved due to the improvements in external resistance (Rext) and channel resistance (Rch) as a result of the relatively large stress in both sets of fins (and thus the relatively large and beneficial stress in the channel region of both the n-MOS and p-MOS devices formed therefrom). Another benefit, in some embodiments, is the ability to achieve co-integrated n-MOS and p-MOS devices that include relatively large stresses of the desired type (e.g., tensile for n-MOS and compressive for p-MOS), while also utilizing desired materials for the two devices (e.g., Si/SiGe with relatively low Ge content for n-MOS devices and Ge/SiGe with relatively high Ge content for p-MOS devices). In some such embodiments, because the desired materials are used for the two different devices, they can each utilize contact, gate dielectric, and doping strategies that are employed for the respective devices. Numerous configurations and variations will be apparent in light of this disclosure.

Architecture and Methodology

FIGS. 1A-D illustrate methods 100A-D of forming an integrated circuit (IC) including dual-strain fins for co-integrated n-MOS and p-MOS devices, in accordance with some embodiments of the present disclosure. Each of methods 100A-D include techniques for forming dual-strained fins (both tensile-strained and compressive-strained fins) to be used in forming n-MOS and p-MOS devices, as will be apparent in light of this disclosure. FIGS. 2A-H illustrate example IC structures formed when carrying out method 100A of FIG. 1A, specifically up to box 116 (where dual-strained fins have been formed), in accordance with some embodiments. FIGS. 3A-H illustrate example IC structures formed when carrying out method 100B of FIG. 1B, specifically up to box 116 (where dual-strained fins have been formed), in accordance with some embodiments. FIGS. 4A-H illustrate example IC structures formed when carrying out method 100C of FIG. 1C, specifically up to box 116 (where dual-strained fins have been formed), in accordance with some embodiments. FIGS. 5A-H illustrate example IC structures formed when carrying out method 100D of FIG. 1D, specifically up to box 117 (where dual-strained fins have been formed), in accordance with some embodiments. FIGS. 6A-D illustrate example IC structures formed when continuing methods 100A-D of FIGS. 1A-D, specifically continuing after the dual-strained fins have been formed and carrying out box 120 to complete transistor processing, in accordance with some embodiments. Thus, methods 100A-D will primarily be described using the structures of FIGS. 2A-H, 3A-H, 4A-H, and 5A-H, respectively, to the point in the process flow where the dual-strained fins have been formed. Then, additional processing for methods 100A-D (which will be similar or the same for each method, once the dual-strained fins have been formed) will be described using the structures of FIGS. 6A-D, as will be apparent in light of this disclosure.

Note that the techniques and structures described herein are primarily depicted and described in the context of forming finned or FinFET transistor configurations (e.g., tri-gate transistor configurations), for ease of illustration. However, in some embodiments, the techniques may be used to form transistors of any suitable geometry or configuration, as will be apparent in light of this disclosure. For example, FIG. 6C illustrates an example integrated circuit structure including transistors having a nanowire configuration, as will be described in more detail below. Also note that the techniques and structures are primarily depicted and described in the context of forming metal-oxide-semiconductor field-effect transistors (MOSFETs), and specifically, forming both n-channel MOSFET (n-MOS) and p-channel MOSFET (p-MOS) devices. However, in some embodiments, the techniques may be used to benefit any suitable transistor type, as will be apparent in light of this disclosure. Further, the techniques may be used to form complementary transistor circuits (such as CMOS circuits), in accordance with some embodiments. Note that in some embodiments, at least one n-MOS device co-integrated with at least one p-MOS device formed using the techniques described herein may include the at least two devices being electrically connected to each other (e.g., in a CMOS circuit). However, in other embodiments, the n-MOS and p-MOS devices need not be electrically connected to each other to be co-integrated, but may instead operate independently from each other and merely be co-integrated using the same substrate. Further still, some embodiments may include a combination of the two aforementioned situations, such that n-MOS and p-MOS devices formed using the techniques described herein and electrically connected to each other (e.g., in a CMOS circuit) are co-integrated with n-MOS and p-MOS devices formed using the techniques described herein and not electrically connected to each other. Other example transistor devices include few to single electron quantum transistor devices, for example. Further still, such devices may employ semiconductor materials that are three dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100A of FIG. 1A includes forming 102 a relaxed silicon germanium (rSiGe) buffer layer on and/or above a substrate such as is shown in FIG. 2A, in accordance with some embodiments. Substrate 200, in some embodiments, may include: a bulk substrate including group IV semiconductor material, such as silicon (Si), germanium (Ge), silicon germanium (SiGe), or silicon carbide (SiC), and/or any other suitable material(s) as will be apparent in light of this disclosure; an X on insulator (XOI) structure where X is one of the aforementioned materials (e.g., group IV semiconductor material) and the insulator material is an oxide material or dielectric material or some other electrically insulating material; or some other suitable multilayer structure where the top layer includes one of the aforementioned materials (e.g., group IV semiconductor material). Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. Note that group IV semiconductor material may also be known as the carbon group or IUPAC group 14, for example. In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped, such as including a dopant concentration of less than 1E16 atoms per cubic centimeter (cm), for example.

In some embodiments, substrate 200 may include a surface crystalline orientation described by a Miller Index of <100>, <110>, or <111>, or its equivalents, as will be apparent in light of this disclosure. Although substrate 200, in this example embodiment, is shown as having a thickness (dimension in the Y-axis direction) similar or smaller than other layers shown in subsequent structures for ease of illustration, in some instances, substrate 200 may be relatively much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

In some embodiments, rSiGe buffer layer 210 may be formed using any suitable techniques, such as one or more of chemical vapor deposition (CVD), metalorganic CVD (MOCVD), physical vapor deposition (PVD), atomic layer deposition (ALD), molecular beam epitaxy (MBE), and/or any other suitable process as can be understood based on this disclosure. In some embodiments, rSiGe buffer layer 210 may be blanket grown (e.g., over the entirety of substrate 200 or over the entirety of at least one portion of substrate 200) or the rSiGe buffer layer may be grown in fin-shaped trenches formed using an aspect ratio trapping (ART) scheme that includes forming fins from the substrate 200 (or from a layer on/above the substrate 200), depositing shallow trench isolation (STI) material, and recessing the fins to form fin-shaped trenches in which the rSiGe layer can be formed. However, note that in some embodiments, the rSiGe layer 210 may instead be a bulk substrate (e.g., a bulk wafer), such that substrate 200 need not be present. In some embodiments, rSiGe layer 210 may include any suitable thickness (dimension in the Y-axis direction), such as a thickness of at least 0.02 (20 nm)-5 microns thick (e.g., at least 0.02, 0.03, 0.04, 0.05, 0.75, 0.1, 0.2, 0.3, 0.4, 0.5, 0.6, 0.7, 0.8, 0.9, 1, 2, 3, 4, or 5 microns thick, or a thickness of at least 0.02-0.05, 0.02-0.1, 0.02-0.2, 0.02-0.5, 0.02-1, 0.05-0.1, 0.05-0.2, 0.05-0.5, 0.05-1, 0.05-2, 0.05-5, 0.1-0.2, 0.1-0.3, 0.1-0.4, 0.1-0.5, 0.1-1, 0.1-2, 0.1-3, 0.1-4, 0.2-0.5, 0.2-1, 0.2-2, 0.2-3, 0.2-4, 0.2-5, 0.5-1, 0.5-2, 0.5-3, 0.5-4, 0.5-5, 1-2, 1-3, 1-4, 1-5, 2-3, 2-4, 2-5, 3-4, 3-5, or 4-5 microns), or any other threshold value or range as will be apparent in light of this disclosure. In some embodiments, rSiGe buffer layer 210 may include a thickness of at least its strain relaxation critical thickness (hc), such that it is considered a metamorphic layer (as opposed to growing it below its strain relaxation critical thickness, making it a pseudomorphic layer). As can be understood based on this disclosure, in some such embodiments, because rSiGe buffer layer 210 is grown beyond its strain relaxation critical thickness, the top surface of the layer will have the same lattice constant as the SiGe material included in that layer 210, due to any strain/lattice mismatch/defects at the 200/210 interface relaxing as layer 210 exceeds its strain relaxation critical thickness. Note that although rSiGe buffer layer 210 is referred to as such herein, the layer 210 need not be relaxed or include relaxed SiGe material throughout the entirety of the layer 210, but may only be relaxed at or near the top surface of the layer, farthest from the substrate 200/rSiGe buffer layer 210 interface, as can be understood based on this disclosure. Thus, in some embodiments, rSiGe buffer layer 210 may be relaxed (include no to very minimal stress/strain) in at least a portion of the layer 210.

In some embodiments, rSiGe buffer layer 210 includes SiGe with a Ge concentration (based on atomic percentage) in the range of 10-90% (e.g., in the subrange of 10-30, 10-50, 10-70, 20-40, 20-60, 20-80, 30-50, 30-70, 30-90, 40-60, 40-80, 50-70, 50-90, 60-80, or 70-90% Ge concentration). In some embodiments, the Ge concentration (based on atomic percentage) may be approximately 10% ($Si_{0.9}Ge_{0.1}$), 15% ($Si_{0.85}Ge_{0.15}$), 20% ($Si_{0.8}Ge_{0.2}$), 25% ($Si_{0.75}Ge_{0.25}$), 30% ($Si_{0.7}Ge_{0.3}$), 35% ($Si_{0.65}Ge_{0.35}$), 40% ($Si_{0.6}Ge_{0.4}$), 45% ($Si_{0.55}Ge_{0.45}$), 50% ($Si_{0.5}Ge_{0.5}$), 55% ($Si_{0.45}Ge_{0.55}$), 60% ($Si_{0.4}Ge_{0.6}$), 65% ($Si_{0.35}Ge_{0.65}$), 70% ($Si_{0.3}Ge_{0.7}$), 75% ($Si_{0.25}Ge_{0.75}$), 80% ($Si_{0.2}Ge_{0.8}$), 85% ($Si_{0.15}Ge_{0.85}$), or 90% ($Si_{0.1}Ge_{0.9}$), to provide some specific example approximate (e.g., plus or minus 0.5, 1, 1.5, or 2%) values. In some embodiments, the Ge concentration (by atomic percentage) in the SiGe material of the rSiGe buffer layer 210 may be selected relative to substrate 200 (e.g., the material of substrate 200) and/or relative to overlying material to be formed on rSiGe buffer layer 210 (e.g., the material of the tensile-strained fins and/or compressive strained fins), as will be described in more detail herein. In some embodiments, rSiGe buffer layer 210 may be doped with any suitable n-type and/or p-type dopant. However, in some embodiments, buffer layer 210 may be undoped/intrinsic or relatively minimally doped, such as including a dopant concentration of less than 1E16 atoms per cubic cm.

Note that although rSiGe buffer layer 210 is illustrated as a single layer in FIG. 2A, the present disclosure is not intended to be so limited. For instance, in some embodiments, rSiGe buffer layer 210 may include a multilayer structure, such that the layer 210 includes at least two material layers (whether in the Y-axis direction, in the X-axis direction, and/or in the Z-axis direction). In some such embodiments, rSiGe buffer layer 210 may be formed using a layer-by-layer epitaxial growth approach (e.g., using an MBE process), such that layer 210 may or may not appear to have distinct interfaces within the layer 210, depending on the particular configuration and observation level. In some embodiments, the concentration of one or more materials may be graded (e.g., increased and/or decreased) throughout at least a portion of rSiGe buffer layer 210 (e.g., as buffer layer 210 is grown in the Y-axis direction). For example, in some such embodiments, the Ge concentration (and thus, the Si concentration) may be graded throughout at least a portion of rSiGe buffer layer 210, such that the Ge concentration in the layer 210 is increased and/or decreased in some manner.

Method 100A of FIG. 1A continues with forming 104 fins from the rSiGe buffer layer to form the example resulting structure of FIG. 2B, in accordance with some embodiments. In some embodiments, rSiGe buffer layer fins 212 may be formed 104 using any suitable techniques, such as including one or more masking, patterning, lithography, and/or etching (e.g., wet and/or dry etching) processes, as can be understood based on this disclosure. Recall that in some embodiments, fins may have alternatively been formed in substrate 200, such as where the rSiGe buffer layer material is to be formed in fin-shaped trenches using an ART scheme (as opposed to using the blanket growth approach for the rSiGe buffer layer primarily described herein). In some embodiments, the buffer layer fin widths BFw may be in the range of 4-400 nm, for example, or any other suitable value, as will be apparent in light of this disclosure. In some embodiments, the buffer layer fin heights BFh may be in the range of 4-800 nm, for example, or any other suitable value, as will be apparent in light of this disclosure. In some embodiments, the height to width ratio of the rSiGe buffer layer fins (BFh:BFw) may be greater than 1, such as greater than 1.5, 2, 2.5, 3, 3.5, 4, 4.5, 5, 6, 7, 8, 9, or 10, or any other suitable threshold ratio, as will be apparent in light of this disclosure.

Note that the buffer layer fins 212 (and the trenches 215 therebetween) are shown as having similar or the same sizes and shapes relative to one another in this example structure for ease of illustration; however, the present disclosure is not intended to be so limited. For example, in some embodiments, the buffer layer fins 212 may be formed to have varying heights BFh and/or varying widths BFw that may correspond with the final desired fin heights (Fh) and fin widths (Fw) described in more detail herein. Further note that although four buffer layer fins 212 are shown in the example structure of FIG. 2B for ease of illustration, any number of fins may be formed, such as one, two, three, five, ten, hundreds, thousands, millions, and so forth, as can be understood based on this disclosure. Also note that fins 212 are shown in FIG. 2B as having a height (BFh) that is relatively greater than the thickness (dimension in the Y-axis direction) of both the remainder of layer 210 and substrate 220, for ease of illustration. However, in some embodiments, the height of fins 212 (shown as BFh) may be relatively less than the thickness of the remainder of layer 210 (e.g., the portions between trenches 215 and substrate 200) and/or substrate 200, for example.

Figure 2C:
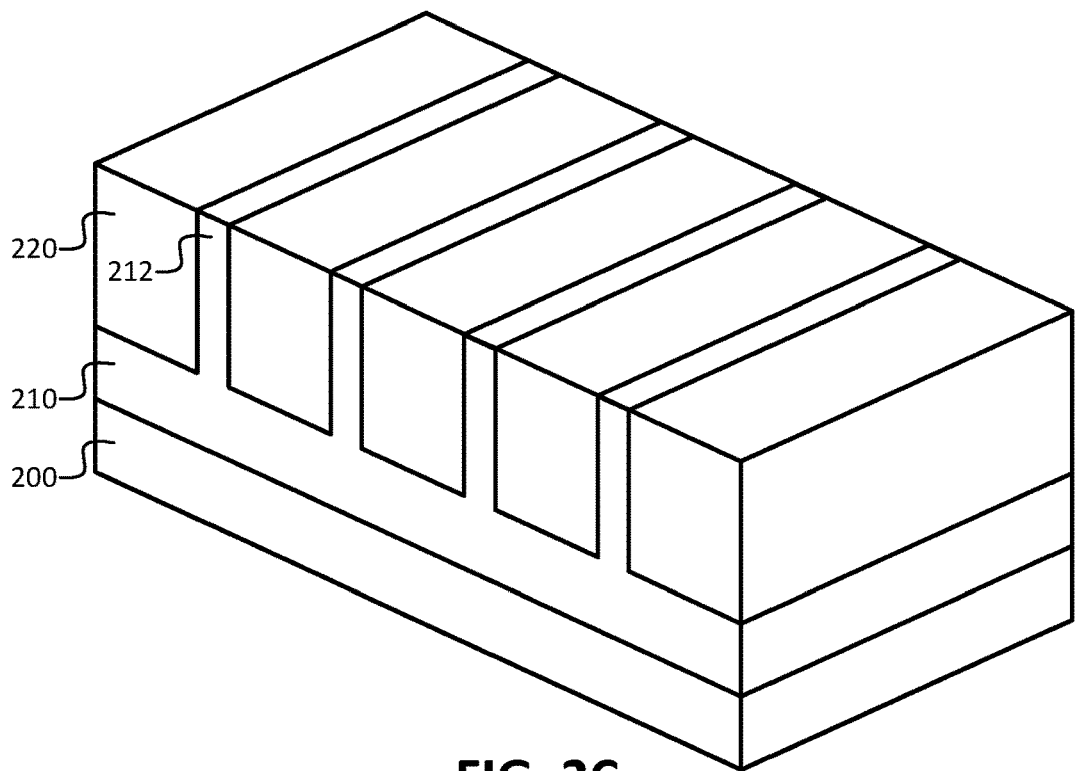

Method 100A of FIG. 1A continues with forming 106 shallow trench isolation (STI) material around fins 212 to form the example resulting structure of FIG. 2C, in accordance with some embodiments. In some embodiments, the STI material 220 may be deposited/grown using any suitable techniques as will be apparent in light of this disclosure, such as using any of the techniques described herein (e.g., CVD, PVD, ALD), for example. In some embodiments, an optional planarization process may be formed after depositing/forming the STI material 220, such as a chemical mechanical polish/planarization (CMP) process, for example. In some embodiments, sacrificial material 230 may include any suitable material, such as one or more dielectric, oxide (e.g., silicon dioxide), and/or nitride (e.g., silicon nitride) materials, for example. In some embodiments, the STI material 220 may be selected based on the material of fins 212, for example, such that the two materials are different to enable selectively etching the fins 212 to remove them (or at least recess them), thereby forming fin-shaped trenches, as will be described in more detail below.

Figure 2D:
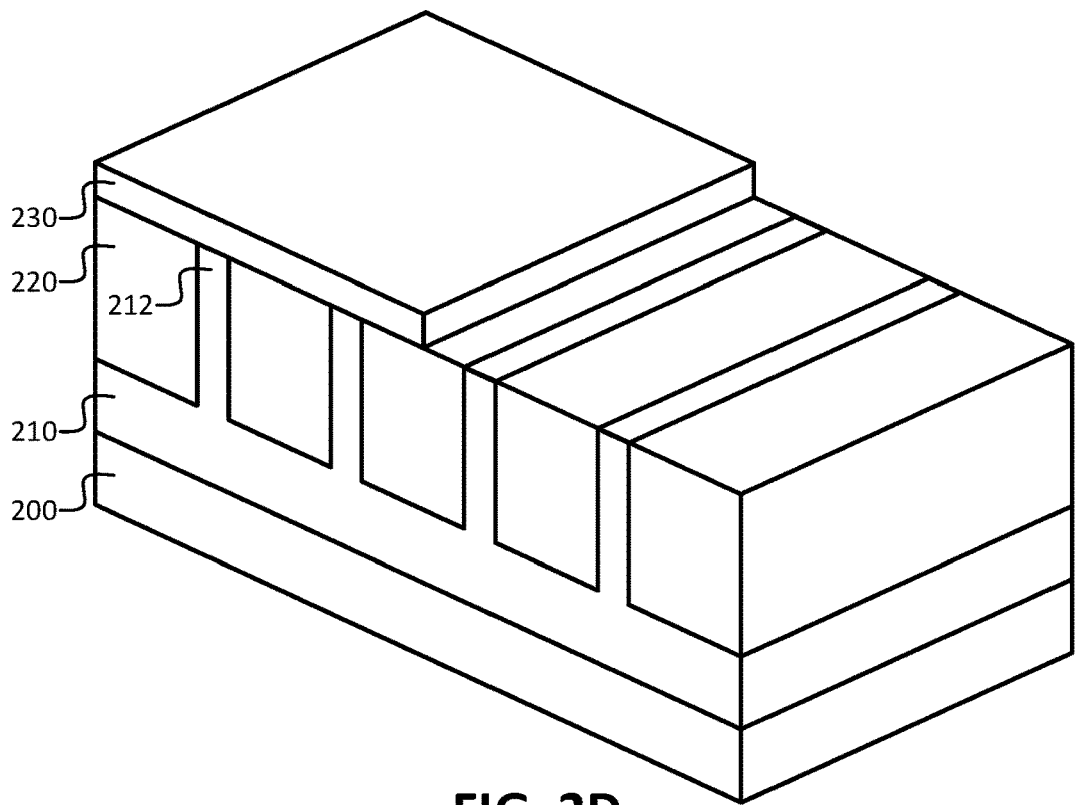

Method 100A of FIG. 1A continues with masking off 108 a subset of the fins 212 to allow processing of another subset of the fins 212, thereby forming the example resulting structure of FIG. 2D, in accordance with some embodiments. In some embodiments, hardmask 230 may be formed using any suitable techniques, such as just forming hardmask 230 as shown (e.g., via a deposition or growth process) or by forming a hardmask layer over the entirety of the structure shown in FIG. 2C and patterning the hardmask (e.g., via etch processing) to leave just the portion shown over the left-most two fins 212 in FIG. 2D, for example. In some embodiments, hardmask 230 may include any suitable material, such as various oxide or nitride materials (or other suitable dielectric materials), for example. Specific oxide and nitride materials may include silicon oxide, titanium oxide, hafnium oxide, aluminum oxide, silicon nitride, or titanium nitride, just to name a few. In some embodiments, the material of hardmask 230 material may be selected based on other materials of the structure of FIG. 2D (e.g., based on STI material 220). As shown in FIG. 2D, the left-most two fins 212 (a subset of fins) have been masked off to allow for processing of the right-most two fins 212 (the other subset of fins).

Figure 2E:
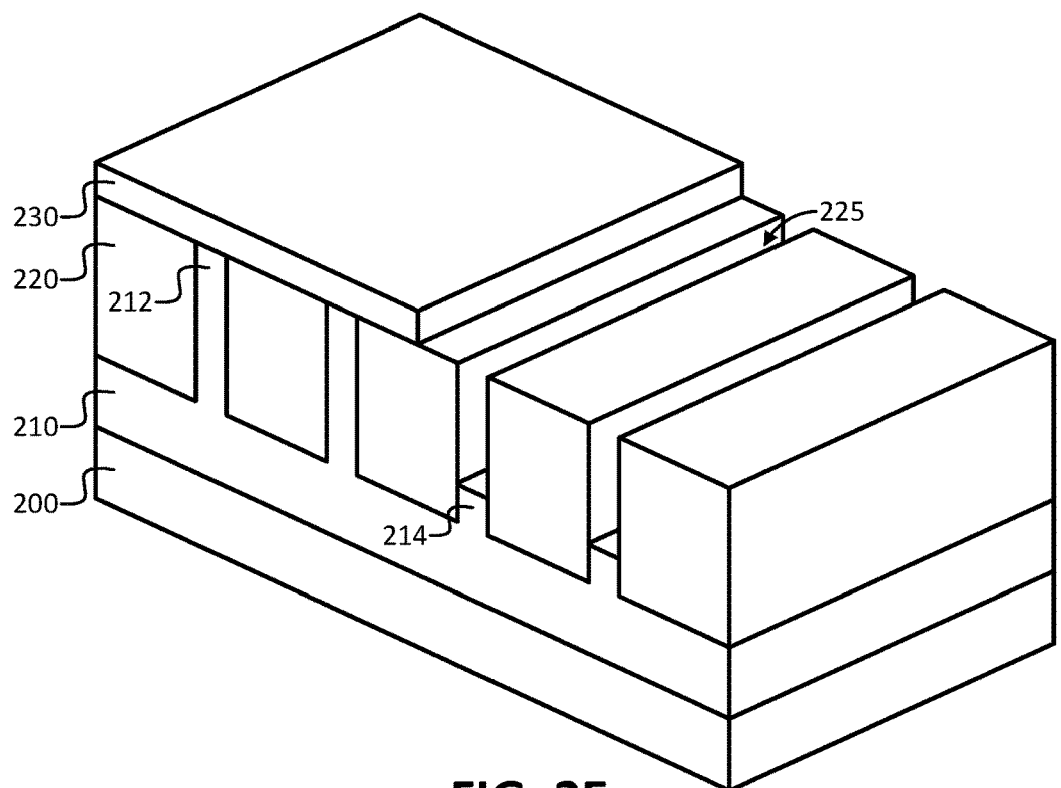

Method 100A of FIG. 1A continues with removing or recessing 110 the other subset of fins (the right-most two fins, in this example case, that are not masked off) to form fin-shaped trenches 225 as shown in the example resulting structure of FIG. 2E, in accordance with some embodiments. In some embodiments, the removal/recess process 110 may be performed using any suitable techniques, such as using selective etch processing that removes the material of the exposed fins 212 relative to the STI material 220, such as at a relatively faster rate (e.g., at least 1.5-100 times faster), thereby allowing for the complete or partial removal of fins 212. In some such embodiments, STI material 220 may only be minimally affected by the selective etch processing (or practically not affected at all), such that the majority or all of STI material structures 220 remain, such as is shown in FIG. 2E. Note that in this example embodiment, the exposed fins (the right-most two fins) were recessed to leave a portion 214 of the fins as shown in FIG. 2E while also forming fin-shaped trenches 225. However, in other embodiments, the exposed fins 212 may be completely removed, recessed more, or recessed less, for example. In some embodiments, the narrow or fin-shaped trenches 225 may include the same or similar dimensions as the original fins 212 (e.g., having the same or similar widths as BFw and having the same or similar heights as BFh, as described herein).

Figure 2F:
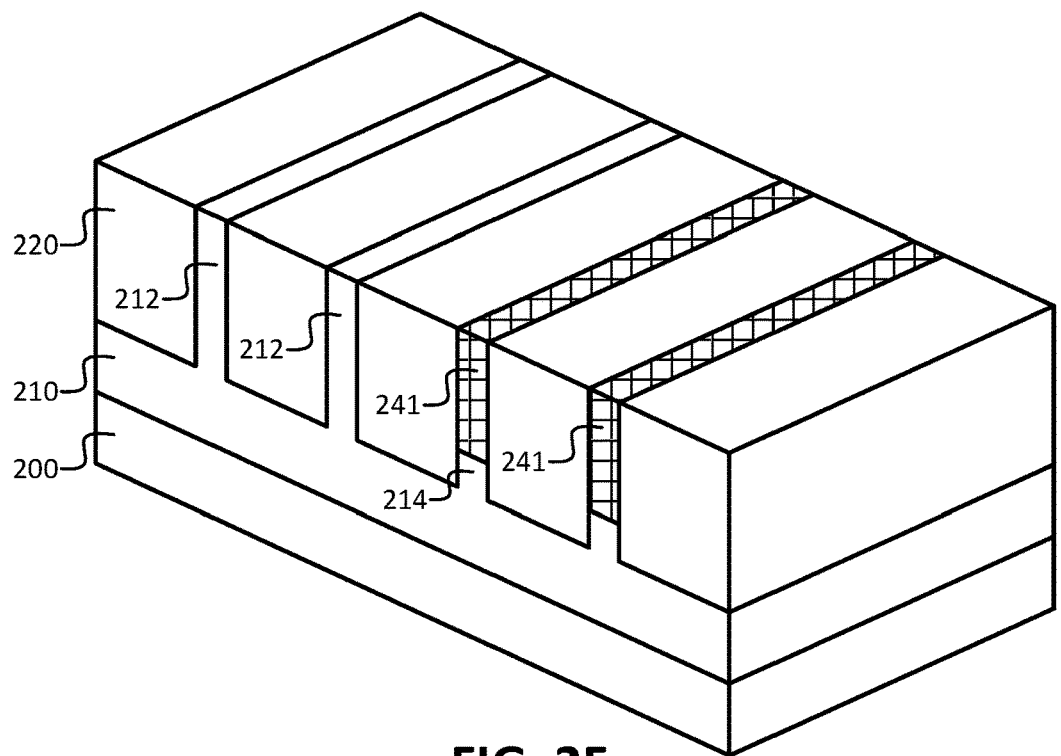

Method 100A of FIG. 1A continues with depositing (or otherwise forming) 112 replacement material in the fin-shaped trenches 225 to form first strained-material fins 241 as shown in the example resulting structure of FIG. 2F, in accordance with some embodiments. In some embodiments, the epitaxial semiconductor material of first strained-material fins 241 may be grown/deposited (or otherwise formed) using any suitable technique, such as one or more of the deposition processes described herein (e.g., CVD, MOCVD, PVD, ALD, MBE). In this example embodiment, a planarization (or re-planarization) process was performed after growing (or otherwise forming) the epitaxial semiconductor material of first strained-material fins 241, such as via a CMP process, for example. As will be apparent in light of this disclosure, first strained-material fins 241 are one of tensile strained and compressive strained, depending on the relative Ge concentration of the material of fins 241 compared to the Ge concentration of rSiGe buffer layer 210 (specifically, sub-fin portion 214 that remained from rSiGe buffer layer fins 212, in this example case). Generally, in some embodiments, first strained-material fins 241 may include Si, SiGe, or Ge. In some embodiments, first strained-material fins 241 may be doped with any suitable n-type and/or p-type dopant. However, in some embodiments, fins 241 may be undoped/intrinsic or relatively minimally doped, such as including a dopant concentration of less than 1E16 atoms per cubic centimeter (cm), for example. First strained-material fins 241 will be described in more detail herein with reference to FIG. 2H.

Although first strained-material fins 241 are illustrated as single material/layer features in FIG. 2F, the present disclosure is not intended to be so limited. For instance, in some embodiments, one or more of the fins 241 may include a multilayer structure, such that one or more of the fins 241 includes at least two layers. In some such embodiments, the fins 241 may be formed using a layer-by-layer epitaxial growth approach (e.g., using an MBE process), such that the fins 241 may or may not appear to have distinct interfaces within the feature, depending on the particular configuration and observation level. In embodiments employing a nanowire (or nanoribbon or GAA) transistor configuration, a multilayer structure including sacrificial material may be utilized, such that the sacrificial material can be removed (e.g., via a selective etch process) to release the nanowires (or nanoribbons) in the channel region of the transistor, as can be understood based on this disclosure. For instance, in an example embodiment, one or more group IV and/or group III-V semiconductor material layers may be alternated with one or more of the second strained-material layers to enable the formation of one or more second strained-material nanowires (e.g., where the group IV and/or group III-V layers are subsequently removed, such as during replacement gate processing). In some embodiments, the concentration of one or more materials may be graded (e.g., increased and/or decreased) throughout one or more of the first strained-material fins 241 (e.g., as the epitaxial semiconductor material to be used for the fins 241 is grown in the Y-axis direction). Note that the use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13 and group V may also be known as the nitrogen family or IUPAC group 15, for example.

Figure 2G:
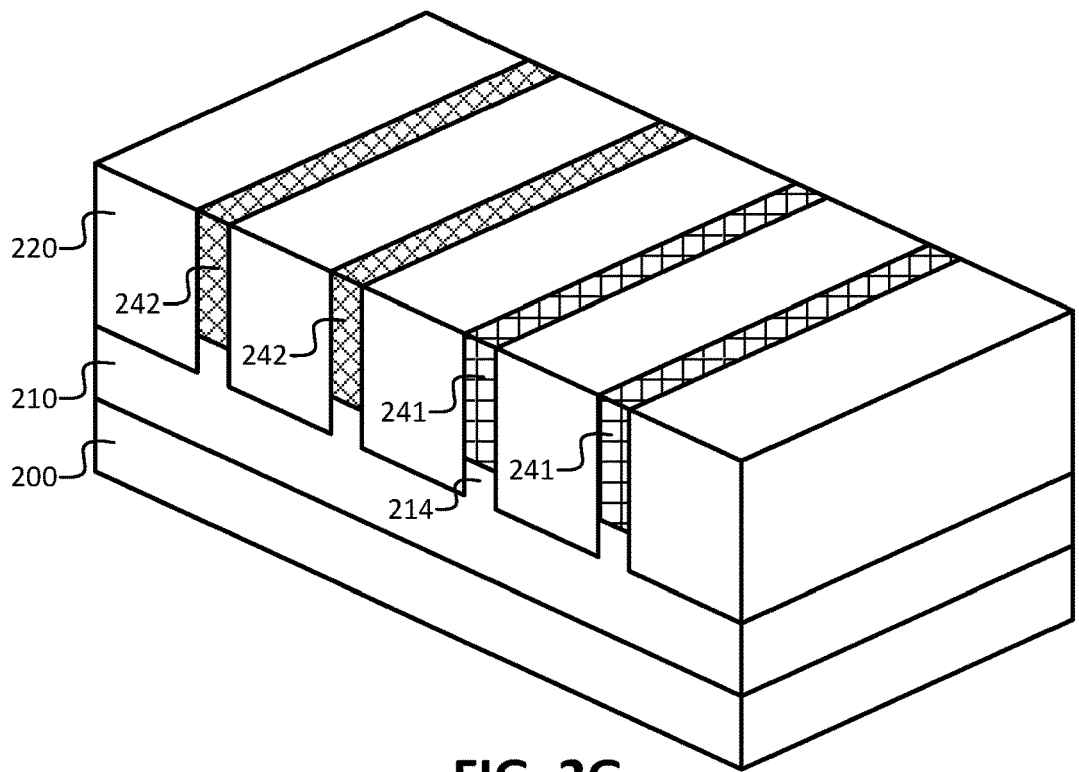

Method 100A of FIG. 1A continues with repeating 114 boxes 108-112 to form two different sets of strained-material fins 241 and 242, as shown in the example resulting structure of FIG. 2G, in accordance with some embodiments. For instance, continuing from the structure of FIG. 2F, the processing to form the structure of FIG. 2G may include masking off the right-most two fins 241 (e.g., using hardmask 230 as described above), recessing/removing the leftmost two fins (e.g., recessing fins 212 leaving remainder portions 214 and fin-shaped trenches, such as was the case when forming fin-shaped trenches 225 above), depositing replacement material in the fin-shaped trenches to form second strained-material fins 242, and performing a planarization (or re-planarization process), resulting in the structure of FIG. 2G, as can be understood based on this disclosure. Note that repeating 114 boxes 108-112 may be performed as many times as desired to form any number of sets of different fins, such that the present disclosure is not intended to be limited to only one repeating 114 process and only two sets of different fins, unless stated otherwise. In some embodiments, second strained-material fins 242 include opposite type stress relative to first strained-material fins 241, such that one set of fins 241 or fins 242 include tensile stress (to be used for one or more n-MOS devices) and the other set includes compressive stress (to be used for one or more p-MOS devices). To assist with visually identifying the two different sets of fins 241 and 242, they include different crosshatch shading; however, the crosshatch shading is not intended to limit the present disclosure in any manner or indicate anything other than assisting with visually differentiating between the two fins.

As will be apparent in light of this disclosure, second strained-material fins 242 are one of tensile strained and compressive strained, depending on the relative Ge concentration of the material of fins 242 compared to the Ge concentration of rSiGe buffer layer 210 (specifically, sub-fin portion 214 that remained from rSiGe buffer layer fins 212, in this example case). Generally, in some embodiments, second strained-material fins 242 may include Si, SiGe, or Ge. In some embodiments, second strained-material fins 242 may be doped with any suitable n-type and/or p-type dopant. However, in some embodiments, fins 242 may be undoped/intrinsic or relatively minimally doped, such as including a dopant concentration of less than 1E16 atoms per cubic centimeter (cm), for example. Further, in some embodiments, the doping does not need to be constant in fins 242 (or in any fins described herein). For example, in some such embodiments, the original fins may be over-recessed to allow for the growth of a doped sub-fin followed by growth of an undoped fin. In addition, in some embodiments, the sub-fin may be grown with relatively different Ge concentration (by atomic percentage) than the active fin portion, where such different Ge concentration sub-fin may or may not include different dopant type and/or dopant concentration, for example. Second strained-material fins 242 will be described in more detail herein with reference to FIG. 2H. Although second strained-material fins 242 are illustrated as single material/layer features in FIG. 2G, the present disclosure is not intended to be so limited. For instance, in some embodiments, one or more of the fins 242 may include a multilayer structure, such that one or more of the fins 242 includes at least two layers. In some such embodiments, the fins 242 may be formed using a layer-by-layer epitaxial growth approach (e.g., using an MBE process), such that the fins 242 may or may not appear to have distinct interfaces within the feature, depending on the particular configuration and observation level. In embodiments employing a nanowire (or nanoribbon or GAA) transistor configuration, a multilayer structure including sacrificial material may be utilized, such that the sacrificial material can be removed (e.g., via a selective etch process) to release the nanowires (or nanoribbons) in the channel region of the transistor, as can be understood based on this disclosure. For instance, in an example embodiment, one or more group IV and/or group III-V semiconductor material layers may be alternated with one or more of the second strained-material layers to enable the formation of one or more second strained-material nanowires (e.g., where the group IV and/or group III-V layers are subsequently removed, such as during replacement gate processing). In some embodiments, the concentration of one or more materials may be graded (e.g., increased and/or decreased) throughout one or more of the second strained-material fins 242 (e.g., as the epitaxial semiconductor material to be used for the fins 242 is grown in the Y-axis direction).

Figure 2H:
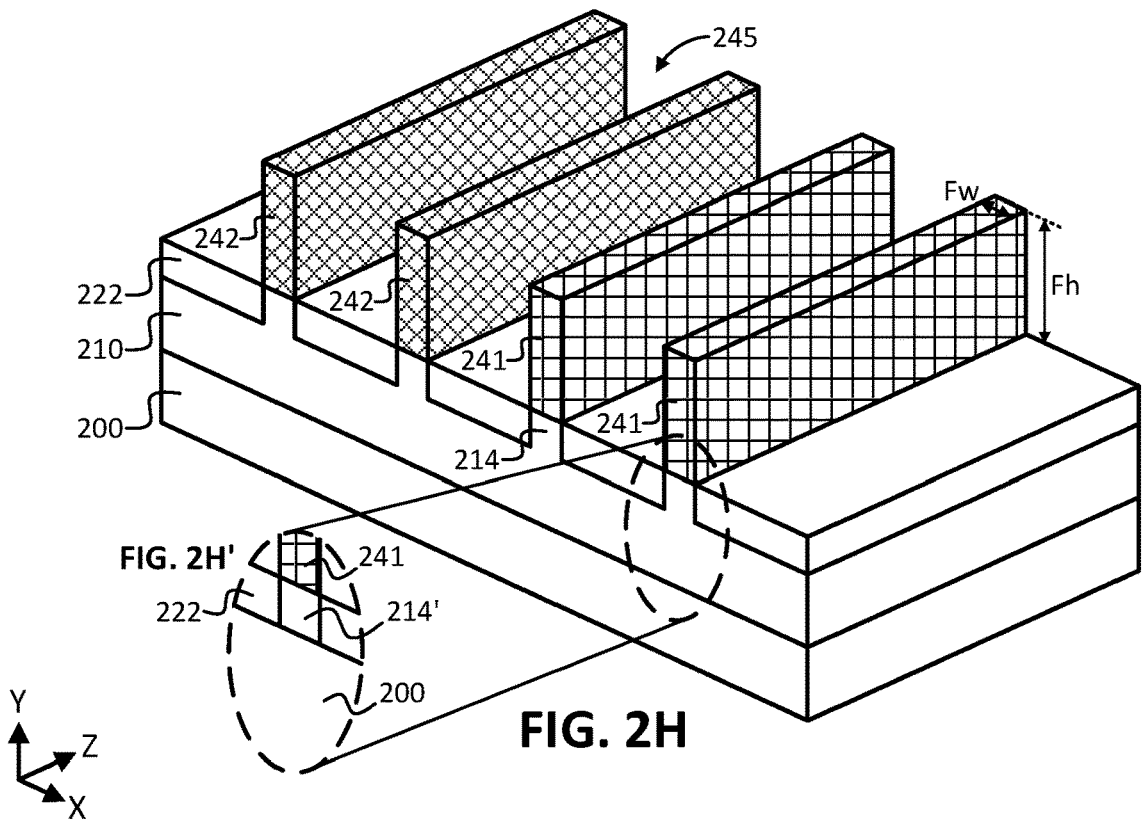

Method 100A of FIG. 1A continues with recessing 116 the STI material 220 to expose the two sets of strained-material fins 241 and 242, thereby forming the example resulting structure of FIG. 2H, in accordance with some embodiments. In some embodiments, STI material 220 may be recessed using any suitable techniques, such as any suitable etch (e.g., wet and/or dry etch) processing, to form the resulting recessed STI material layer 222 shown in FIG. 2H. Note that in some embodiments, the original STI material 220 may be completely removed and replacement STI material may be formed and recessed to form STI layer 222. In this example embodiment, the STI material was recessed to the level of the top of rSiGe buffer layer fin remaining portions 214 (also referred to as sub-fin portions, as they are below what will be active fins 241 and 242). However, in other embodiments, the STI material may be recessed to a higher or lower point (where higher and lower are relative to the Y-axis direction). As shown in FIG. 2H, strained-material fins 241 and 242 exude from the top plane of the STI layer 222, such that they are exposed and can be used to form transistor devices as desired.

Continuing with the example structure of FIG. 2H, a total of four strained-material fins 241 and 242 are shown, with the width (Fw) and height (Fh) of the right-most fin indicated, in this example embodiment. In some embodiments, the fin widths Fw (dimension in the X-axis direction) may be in the range of 4-400 nm (e.g., in the subrange of 4-10, 4-20, 4-50, 4-100, 4-200, 10-20, 10-50, 10-100, 10-200, 10-400, 50-100, 50-200, 50-400, or 100-400 nm), for example, or any other suitable value or range, as will be apparent in light of this disclosure. Further, in some embodiments, the fin heights Fh (dimension in the Y-axis direction) may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, one or more of the fins formed may be formed with a height (Fh) less than the strain relaxation critical thickness of the material of the fin(s), such that the fin(s) maintain any stress formed therein, for example. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or any other suitable threshold ratio, as will be apparent in light of this disclosure.

Note that fins 241 and 242 (and the trenches 245 therebetween) are shown as having similar sizes and shapes relative to one another in this example structure for ease of illustration; however, the present disclosure is not intended to be so limited. For example, in some embodiments, the fins 241 and 242 may be formed to have varying heights Fh and/or varying widths Fw, depending on the desired configuration. For instance, in some such embodiments, the fins within a set may vary in size and/or shape (e.g., the two first strained-material fins 241 may vary relative to each other) and/or the fins of different sets may vary in size and/or shape (e.g., at least one fin from the set of first strained-material fins 241 may differ relative to at least one fin from the set of second strained-material fin 242). Further note that although a total of four fins are shown in the example structure of FIG. 2G for ease of illustration (two each in the set of fins 241 and the set of fins 242), any number of fins may be formed, such as two, three, five, ten, hundreds, thousands, millions, and so forth, as can be understood based on this disclosure.

In some embodiments, the difference in Ge concentration (by atomic percentage) between the rSiGe buffer layer 210 (and thus, portions 214) and the strained-material layers formed thereon (e.g., fins 241 and 242) can determine the amount and type of stress caused in the strained-material layer. For example, forming a Si layer or SiGe layer (with relatively lower Ge concentration/atomic percentage) on the rSiGe layer results in that Si/SiGe layer being strained with tensile stress (as long as the Si/SiGe layer is formed with a thickness below the strain relaxation critical thickness of the material), where the amount of tensile stress is approximately 0.6 gigapascals (GPa) per 10% Ge concentration difference between the rSiGe layer and the overlying Si/SiGe layer. For instance, if Si is formed on a rSiGe layer with 30% Ge concentration (which may be expressed as $rSi_{1-x}Ge_x$, where x would be 0.3, in this example case), then the 30% lesser Ge concentration in the Si layer relative to the $rSi_{0.7}Ge_{0.3}$ layer would result in the Si layer (which may also be expressed as $Si_1Ge_0$) including tensile stress of approximately 1.8-1.9 GPa. Further, if forming a SiGe layer (with relatively higher Ge concentration/atomic percentage) or Ge layer on the rSiGe layer, the SiGe/Ge layer would be strained with compressive stress (as long as the SiGe/Ge layer is formed with a thickness below the strain relaxation critical thickness of the material), where the amount of compressive stress is approximately 0.6 GPa per 10% Ge concentration difference between the rSiGe layer and the overlying SiGe/Ge layer. For instance, continuing with the same $rSi_{0.7}Ge_{0.3}$ layer example, if a layer of $Si_{0.4}Ge_{0.6}$ is formed thereon, then the 30% greater Ge concentration in the $Si_{0.4}Ge_{0.6}$ layer relative to the $rSi_{0.7}Ge_{0.3}$ layer would result in the $Si_{0.4}Ge_{0.6}$ layer including compressive stress of approximately 1.8-1.9 GPa.

Accordingly, in embodiments where one of the first set of fins 241 and the second set of fins 242 is tensile stressed and the other is compressive stressed, one will include relatively lower Ge concentration relative to rSiGe buffer layer 210 (and thus, portions 214) and the other will include relatively higher Ge concentration relative to rSiGe buffer layer 210 (and thus, portions 214), for example. Further, in some such embodiments, the set of fins including tensile stress will include either Si or SiGe (with a Ge concentration less than the Ge concentration of the rSiGe buffer layer) and the set of fins including compressive stress will include either Ge or SiGe (with a Ge concentration greater than the Ge concentration of the rSiGe buffer layer). In some embodiments, it need not matter which of the tensile and compressive-strained fin sets is formed first, so long as both sets are formed. Thus, in some such embodiments, it need not matter which of the first set of fins 241 and the second set of fins 242 is tensile strained and which is compressive strained, so long as there is at least one fin of each strain type (e.g., to form at least one n-MOS device and at least one p-MOS device therefrom).

In some embodiments, the difference in Ge concentration (by atomic percentage) between the rSiGe buffer layer and the overlying strained material layer (whether the overlying layer is tensile strained and includes a lower Ge concentration or whether the overlying layer is compressive strained and includes a higher Ge concentration) may be in the range of 10-90% different Ge concentration (e.g., in the subrange of 10-30, 10-50, 10-70, 20-40, 20-60, 20-80, 30-50, 30-70, 30-90, 40-60, 40-80, 50-70, 50-90, 60-80, or 70-90% or a Ge concentration difference of at least 10, 15, 20, 25, 30, 35, 40, 45, 50, 60, 70, or 80%), or some other suitable value, threshold value, or range, as will be apparent in light of this disclosure. Also note that in some such embodiments, the difference in Ge concentration relative to the rSiGe layer for the tensile-strained and compressive-strained fins need not be the same, such as forming tensile-strained $Si_{0.9}Ge_{0.1}$ fins and compressive-strained $Si_{0.4}Ge_{0.6}$ fins using a $rSi_{0.7}Ge_{0.3}$ buffer layer, for example. In some embodiments, it may be desired to have the dual-strained fins include stress amounts of at least 1 GPa, such as having the Ge concentration differences in both sets of fins be at least 20% (e.g., where the tensile strained fins include at least 20% less Ge concentration than the rSiGe layer and the compressive strained fins include at least 20% more Ge concentration than the rSiGe layer). In general, in some embodiments, the rSiGe layer may include a Ge concentration in the range of 10-90% (e.g., in the subrange of 10-30, 10-50, 10-70, 20-40, 20-60, 20-80, 30-50, 30-70, 30-90, 40-60, 40-80, 50-70, 50-90, 60-80, or 70-90% Ge concentration), the tensile-strained fins may include Si or SiGe with a Ge concentration in the range of 0-80% (e.g., in the subrange of 0-20, 0-40, 0-60, 10-50, 10-80, 20-40, 20-60, 20-80, 40-60, 40-80, or 60-80%), and the compressive-strained fins may include Ge or SiGe with a Ge concentration in the range of 20-100% (e.g., in the subrange of 20-40, 20-60, 20-80, 40-60, 40-80, 40-100, 50-70, 50-100, 60-80, 60-100, or 80-100%), or some other suitable value or range for any of the three materials as will be apparent in light of this disclosure. Numerous material variations and configurations will be apparent in light of this disclosure.

Recall that in the example method 100A of FIG. 1A, the techniques included blanket-growth of the rSiGe buffer layer 210, forming fins 212 therefrom, and replacing the rSiGe buffer layer fins 212 with strained material fins 241 and 242 as described above. However, also recall that in some embodiments, a blanket-grown rSiGe buffer layer need not be formed to achieve the strained material fins 241 and 242. For instance, in some embodiments, substrate 200 may be processed to form fins therefrom, STI material can then be deposited around those fins (that are native to substrate 200), the fins can then be etched to remove or recess the native-to-substrate fins thereby forming fin-shaped trenches between the STI material, and then rSiGe replacement material can be deposited in the fin-shaped trenches to form rSiGe replacement fins, for example. Aspect ratio trapping (ART) can be used to trap the defects on the sidewalls or other suitable techniques could be used to make relaxed SiGe (rSiGe) fins, as can be understood based on this disclosure. The rSiGe replacement fins could then be recessed to allow for the formation of strained layers 241 and 242 as described with reference to FIGS. 2D-H, for example. In addition, the rSiGe films for n-MOS and p-MOS devices could be different by covering the n-MOS areas (e.g., using hardmask) to allow for processing of the p-MOS areas, and then covering the p-MOS areas (e.g., using hardmask) to allow for processing of the n-MOS areas, for example. As can be understood based on such an example process flow, the resulting structure would not include the rSiGe buffer layer between the final STI layer 222 and substrate 200, as the rSiGe material (used to form strained fins 241 and 242 thereon) would only be present in the sub-fin portion of the structure. Such an example structure is illustrated in FIG. 2H', where the structure is the same as that of FIG. 2H, except that the sub-fin portion 214' in FIG. 2H' is the only portion of the rSiGe buffer material between first-strained material fin 241 and substrate 200 as shown (compared to there being additional rSiGe buffer material 210 between fin 241 and substrate 200 in the structure of FIG. 2H). As can be understood based on this disclosure, the ART scheme can be used to achieve the relaxed SiGe replacement material fins (even where the fins do not exceed the strain relaxation critical thickness of the SiGe material), as the fin-shaped trenches in which the replacement SiGe material fins are formed may have a particular height/depth to width ratio (e.g., greater than 1, such as greater than 1.5, 2, 3, 5, 10, or 15) such that the trenches allow for defects in the replacement SiGe material to terminate on a side surface as the material grows vertically, such as non-crystalline/dielectric sidewalls, where the sidewalls are sufficiently high relative to the size of the growth area so as to trap most, if not all, of the defects, thereby achieving relaxed SiGe (rSiGe) replacement fins (from which sub-fin portion 214' can be formed).

Note that the relevant variations and configurations described herein can equally apply to such an ART scheme for forming the rSiGe buffer material (from which strained-material fins are grown). For instance, the example variation of using different rSiGe material from which the different strained-material fins are formed as described below with reference to FIG. 4F' can also apply to the ART scheme of forming rSiGe buffer replacement fins, where two or more different sets of rSiGe buffer replacement fins may be formed, where one set of the rSiGe replacement fins may include a first Ge concentration (by atomic percentage) and another set of the rSiGe replacement fins may include a second Ge concentration. For example, a first set of rSiGe replacement fins may be formed (in the fin-shaped trenches formed using the ART scheme described above) and then recessed to allow for the growth of tensile-strained material fins thereon (e.g., including Si or SiGe with relatively lower Ge concentration than the underlying first rSiGe material), where that first set of rSiGe replacement fins may include a Ge concentration in the range of, e.g., 20-60%, in accordance with some embodiments. In such an example case, a second set of rSiGe replacement fins may be formed (in other fin-shaped trenches formed using the ART scheme described above) and then recessed to allow for the growth of compressive-strained material fins thereon (e.g., including Ge or SiGe with relatively higher Ge concentration than the underlying second rSiGe material), where that second set of rSiGe replacement fins may include a Ge concentration in the range of, e.g., 40-70%, in accordance with some embodiments. As can be understood based on this disclosure, the tensile-strained fins may then be formed into one or more n-MOS devices while the compressive-strained fins may then be formed into one or more p-MOS devices, in accordance with some embodiments.

As previously described, there are a multitude of methods described herein for forming dual-strained fins for the co-integration of n-MOS and p-MOS devices. Method 100A of FIG. 1A was described above to the point of box 116 and to the point of the structure of FIG. 2G. Additional description of method 100A is provided below, specifically for boxes 118 and 120. However, different methods of forming the dual-strained fins (e.g., fins 241 and 242) will first be described below, specifically with reference to methods 100B-D of FIGS. 1B-D as they relate to FIGS. 3A-G, 4A-G, and 5A-G, respectively. For ease of description, where overlaps occur with method 100A of FIG. 1A and the structures formed therefrom (specifically, structures 2A-G), they will be noted, such that the previous relevant description of method 100A and FIGS. 2A-G will be equally applicable to the following description of methods 100B-D. Numerous variations on the techniques of forming dual-strained fins will be apparent in light of this disclosure.

Figure 1B:
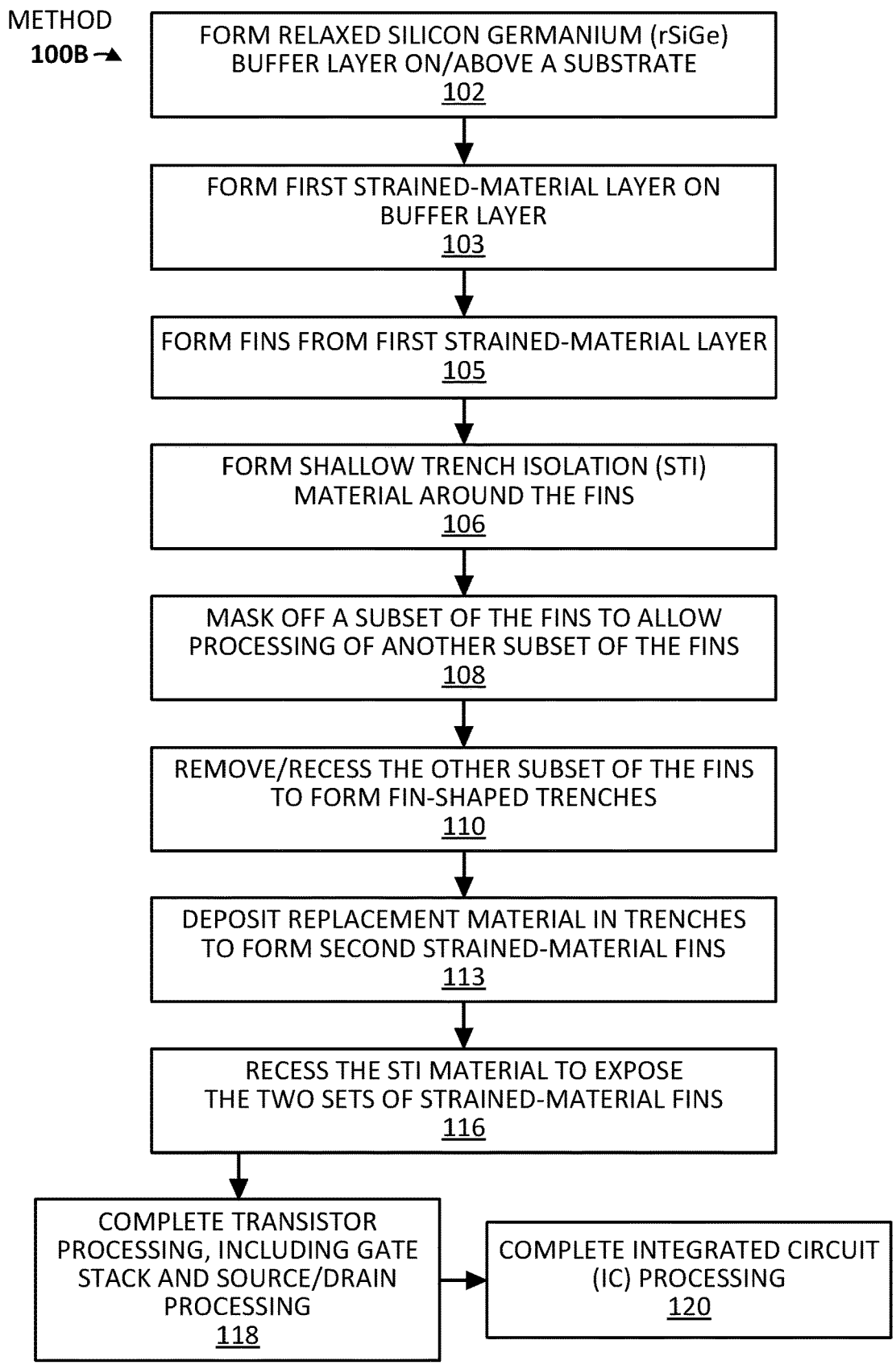
Figure 3A:
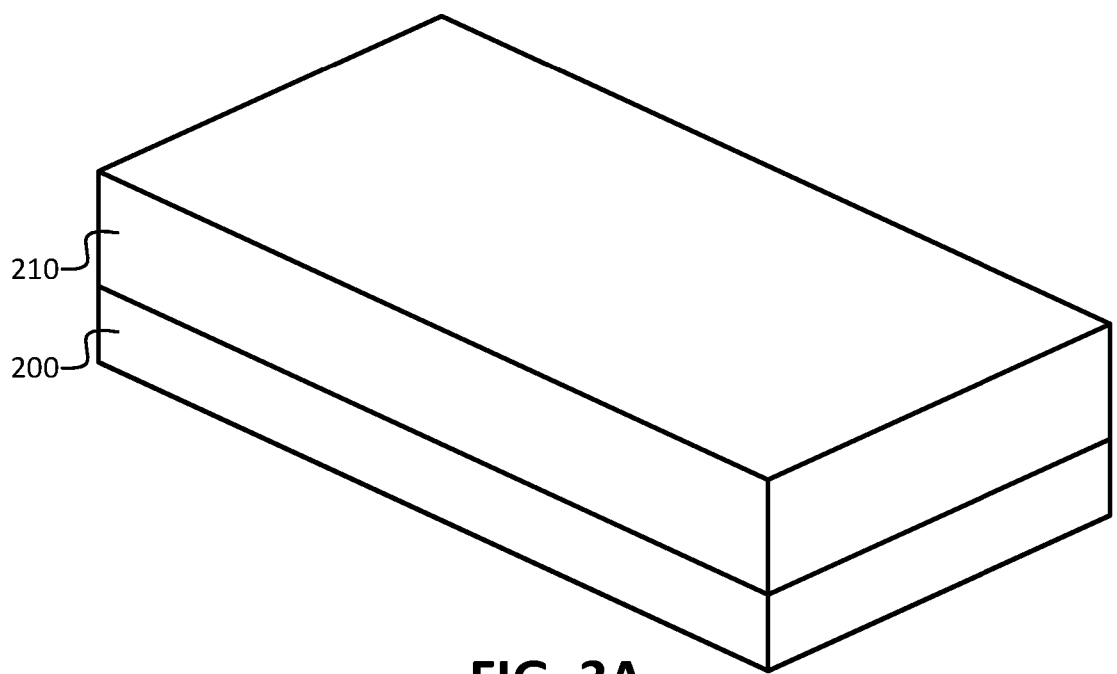
FIGS. 3A-H illustrate example IC structures formed when carrying out the method of FIG. 1B, specifically up to the point that dual-strained fins have been formed, in accordance with some embodiments.
Figure 3B:
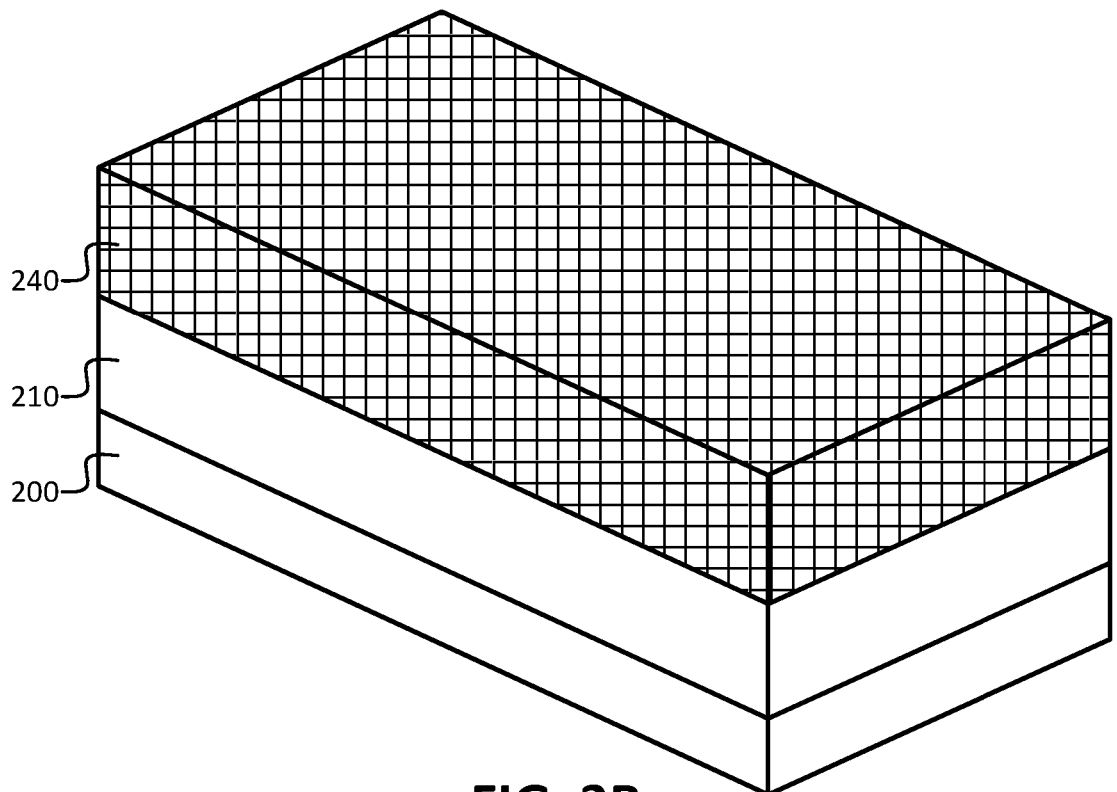

Method 100B of FIG. 1B includes forming 102 rSiGe buffer layer 210 on and/or above substrate 200 to form the example resulting structure of FIG. 3A, in accordance with some embodiments. The previous relevant description of process 102 and the structure of FIG. 2A applies equally here. Method 100B of FIG. 1B continues with forming 103 first strained-material layer 240 on rSiGe buffer layer 210 to form the example resulting structure of FIG. 3B, in accordance with some embodiments. In some embodiments, the epitaxial semiconductor material of first strained-material layer 240 may be grown/deposited (or otherwise formed) using any suitable technique, such as one or more of the deposition processes described herein (e.g., CVD, MOCVD, PVD, ALD, MBE). As can be understood based on this disclosure, first strained-material layer 240 will be formed into first strained-material fins 241, such as those previously described. Therefore, the previous relevant description of first strained-material fins 241 is equally applicable to first strained-material layer 240. For example, the material description is the same, the fin height (Fh) description is the same for the thickness (dimension in the Y-axis direction) of layer 240, and so forth. However, note that the material of first strained-material fins 241 is being first formed using a blanket-growth approach to form layer 240 and then form fins 241 therefrom, in this example embodiment, as opposed to a replacement fin scheme (as was the case for method 100A).

Figure 3C:
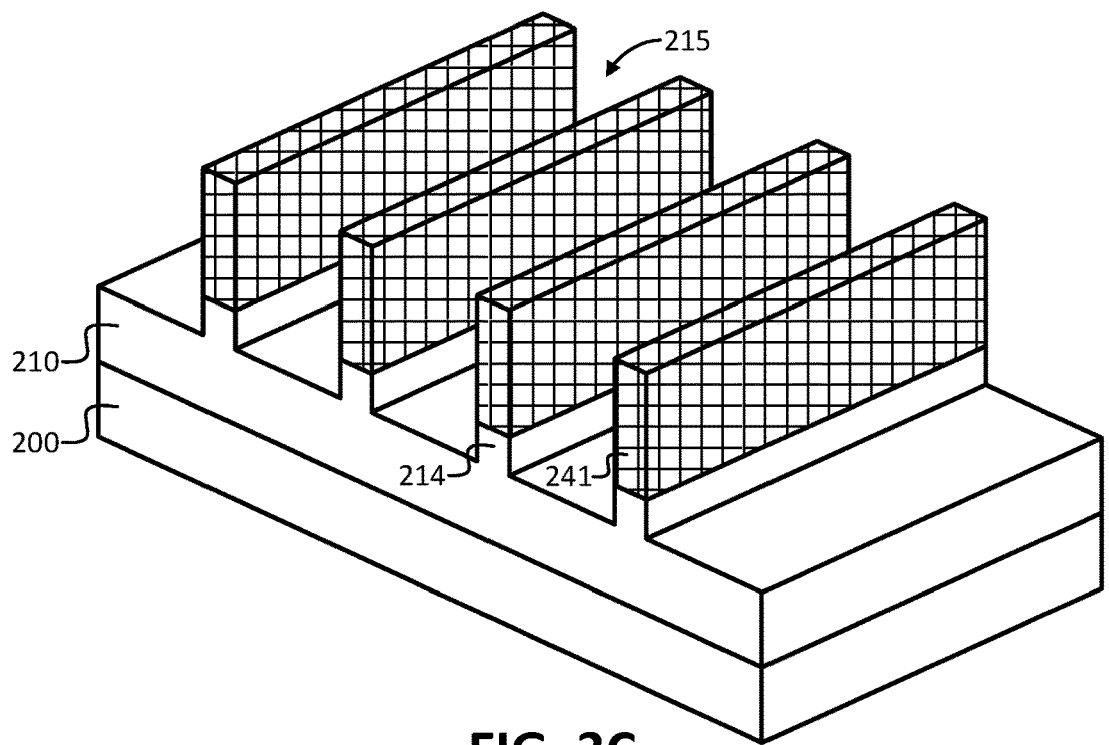
Figure 3D:
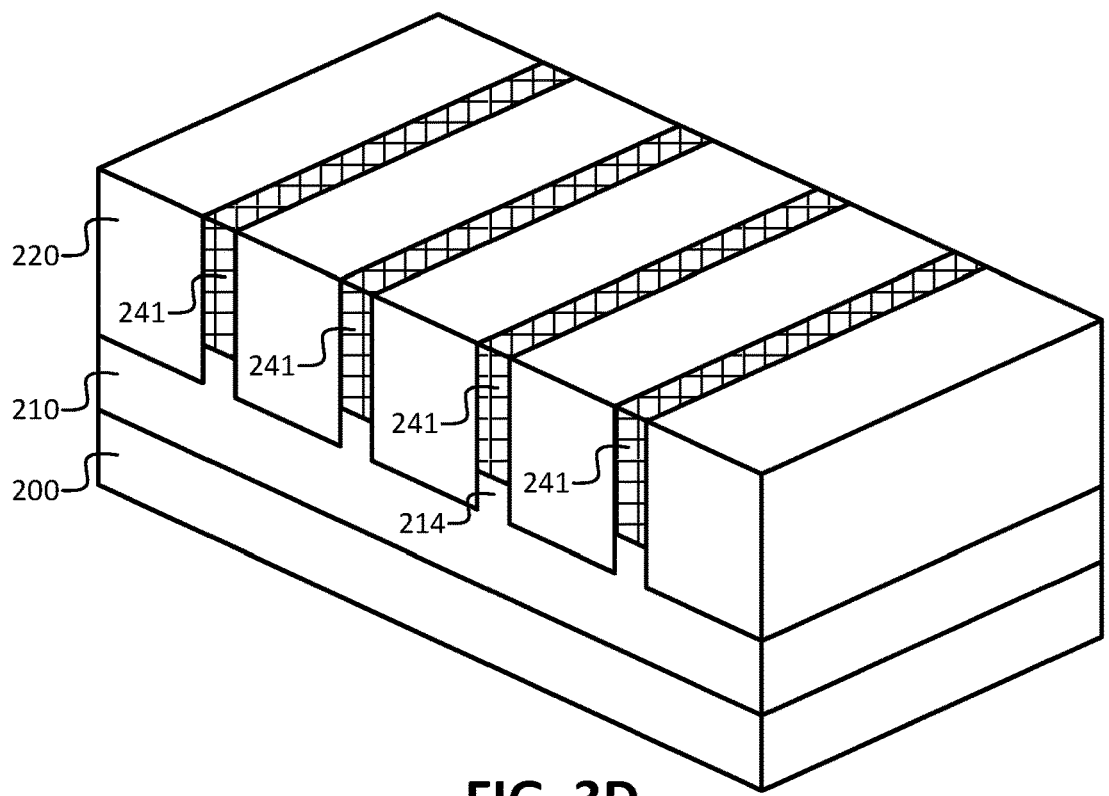
Figure 3E:
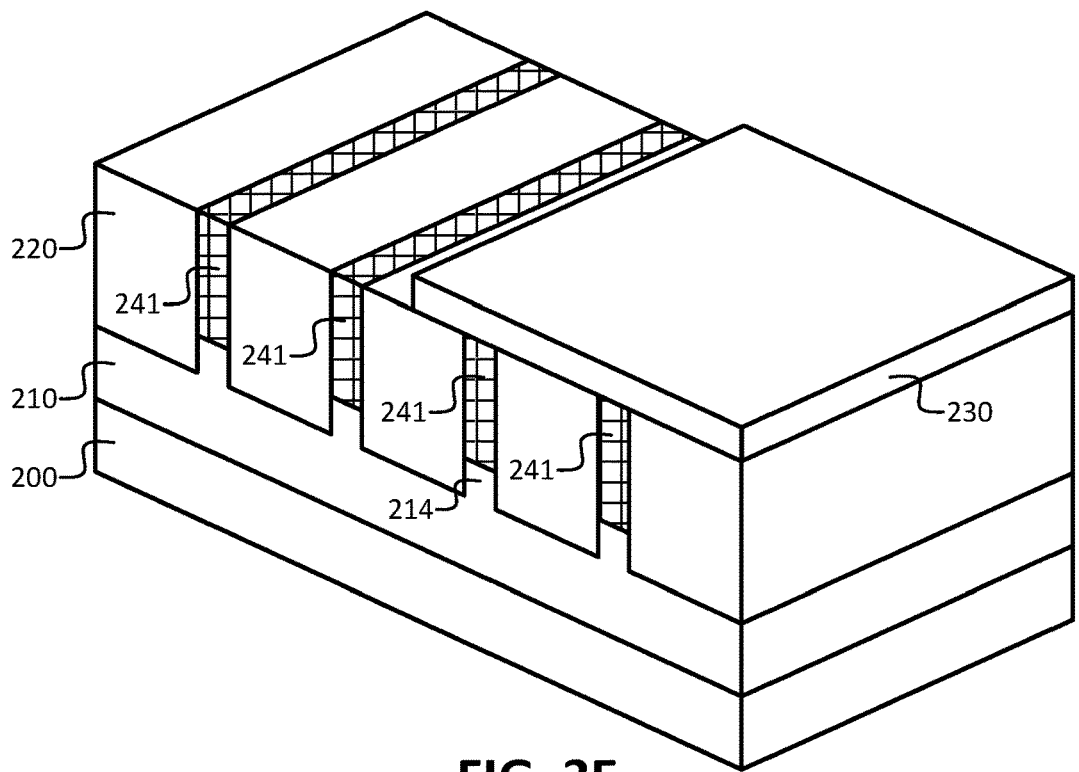

Method 100B of FIG. 1B continues with forming 105 fins 241 from the first strained-material layer 240 to form the example resulting structure of FIG. 3C, in accordance with some embodiments. The previous relevant description with respect to process 104 is equally applicable to process 105. For example, first strained-material fins 241 may be formed 105 using any suitable techniques, such as including one or more masking, patterning, lithography, and/or etching (e.g., wet and/or dry etching) processes, as can be understood based on this disclosure. Method 100B of FIG. 1B continues with forming 106 STI material 220 around first strained-material fins 241 to form the example resulting structure of FIG. 3D, in accordance with some embodiments. The previous relevant description with respect to process 106 and STI material 220 is equally applicable here. However, note that the STI material 220 is being formed around fins 241 in this example case as opposed to the STI material 220 being formed around fins 212 in the example case of method 100A and FIG. 2C. Method 100B of FIG. 1B continues with masking off 108 a subset of the fins (a subset of the first-strained material fins 241, in this example case) to allow processing of another subset of the fins (another subset of fins 241, in this example case), thereby forming the example resulting structure of FIG. 3E, in accordance with some embodiments. The previous relevant description with respect to process 108 and hardmask 230 is equally applicable here, except that hardmask 230 is first formed on the right-most two fins in the example structure of FIG. 3E (as opposed to first forming hardmask 230 on the left-most two fins in the example structure of FIG. 2D), to allow for the end structures of FIGS. 3H and 2H to be the same, for ease of illustration.

Figure 3F:
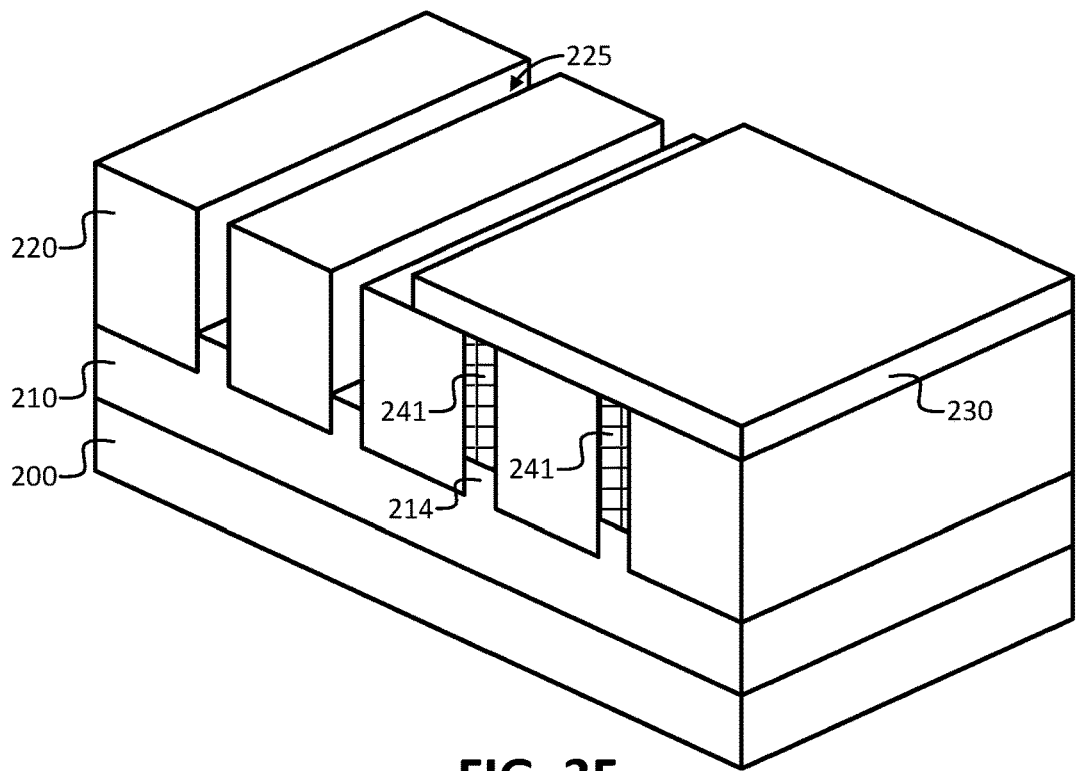
Figure 3G:
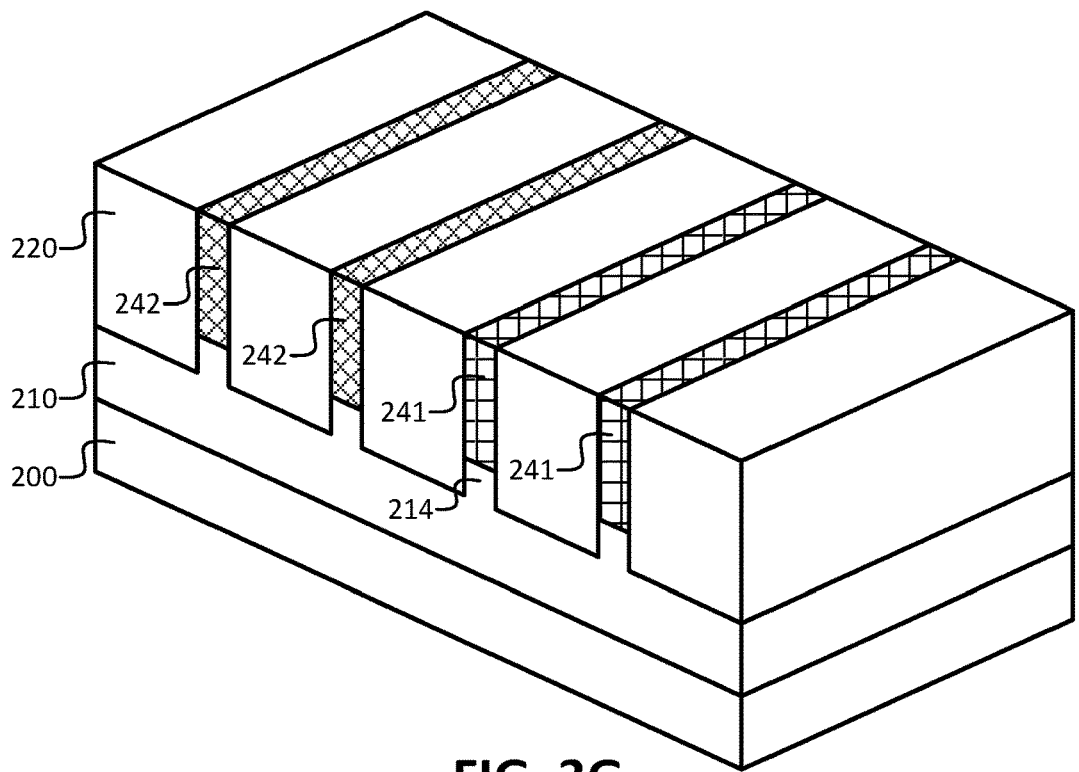
Figure 3H:
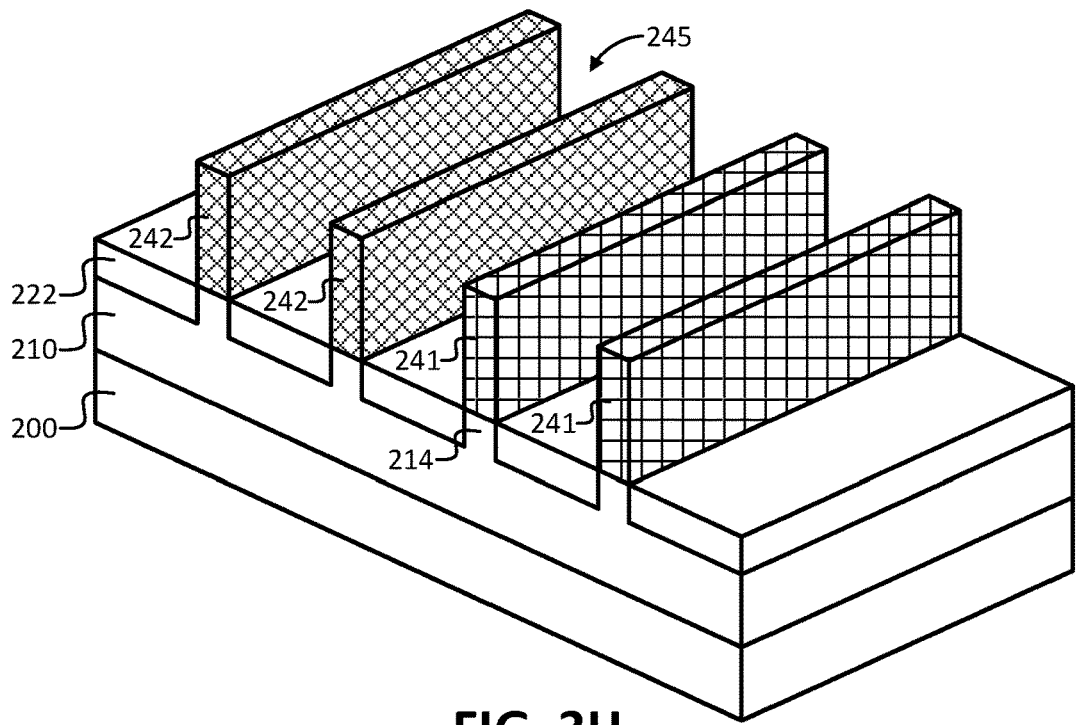

Method 100B of FIG. 1B continues with removing/recessing 110 the other subset of fins (the exposed/non-masked first strained-material fins 241) to form fin-shaped trenches 225 as shown in the example resulting structure of FIG. 3F, in accordance with some embodiments. The previous relevant description with respect to process 110 and fin-shaped trenches 225 is equally applicable here, except that the fin-shaped trenches 225 are being first-formed where the left-most two fins were located. In some such embodiments, the recess/removal process 110 here may be performed using any suitable techniques, such as using selective etch processing that removes the material of the exposed fins 241 relative to the STI material 220, such as at a relatively faster rate (e.g., at least 1.5-100 times faster), thereby allowing for the complete or partial removal of fins 241. Here, a complete removal of the exposed subset of fins 241 occurred, as shown (as opposed to only recessing the exposed fins 212 when describing method 100A). Method 100B of FIG. 1B continues with depositing 113 replacement material in the fin-shaped trenches 225 to form second strained-material fins 242 as shown in the example resulting structure of FIG. 3G, in accordance with some embodiments. The previous relevant description with respect to process 112 is equally applicable to process 113, except that instead of depositing first strained-material to form fins 241 therefrom in the case of process 112, as first-strained material fins 241 are already formed in this example case, process 113 only includes forming second strained-material fins 242 at this stage, as can be understood based on this disclosure. Recall that in method 100A, second strained-material fins 242 were formed during process 116. Method 100B of FIG. 1B continues with recessing 116 the STI material 220 to expose the two sets of strained-material fins 241 and 242 as shown in FIG. 3G, in accordance with some embodiments. The previous relevant description with respect to process 116 is equally applicable here. Moreover, the previous relevant description with respect to the structure of FIG. 2H (and the features of that structure, such as first strained-material fins 241, second strained-material fins 242, and so forth) is equally applicable to the structure of FIG. 3H, as they are the same in this example case.

Figure 1C:
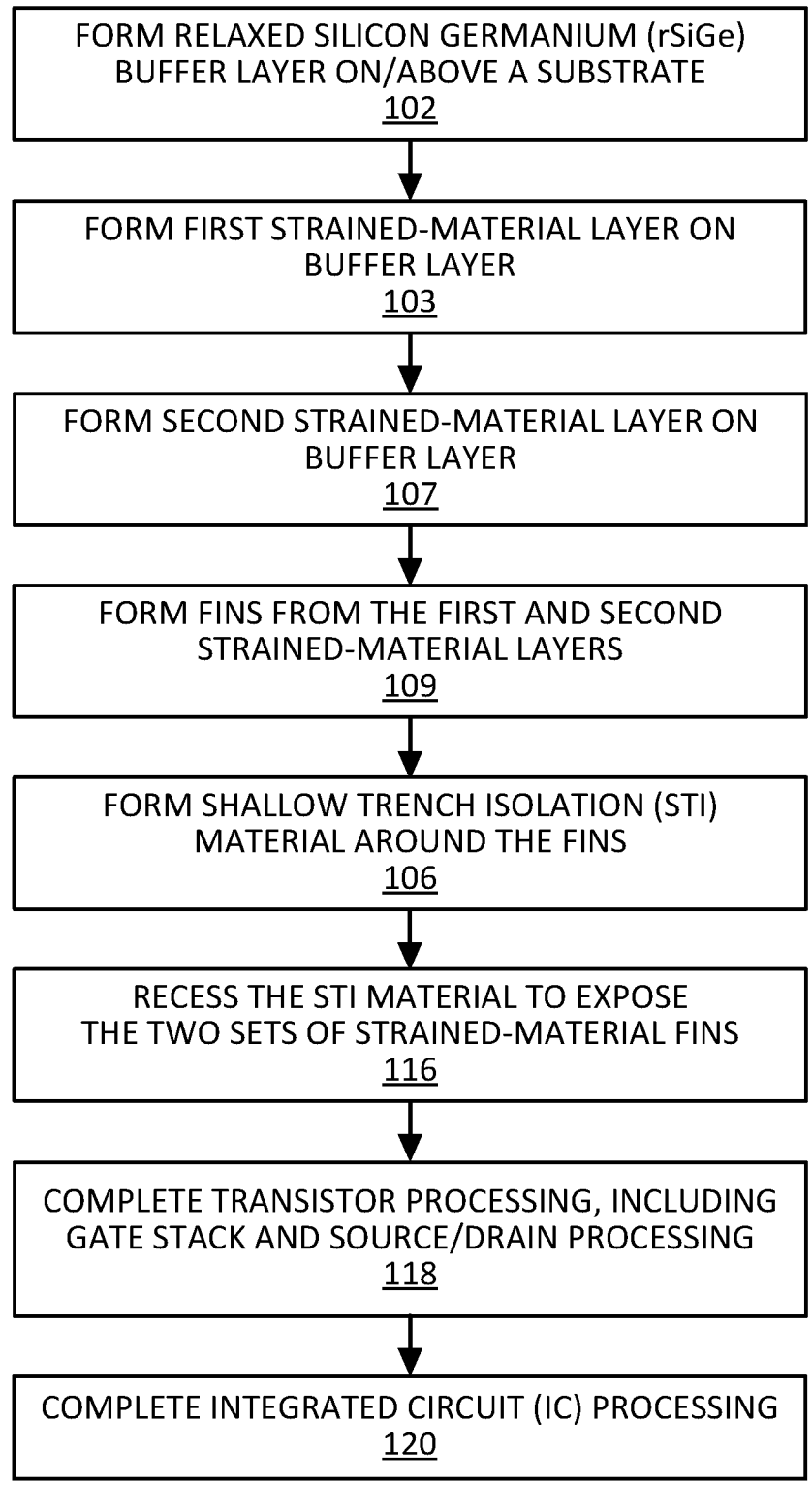
Figure 4A:
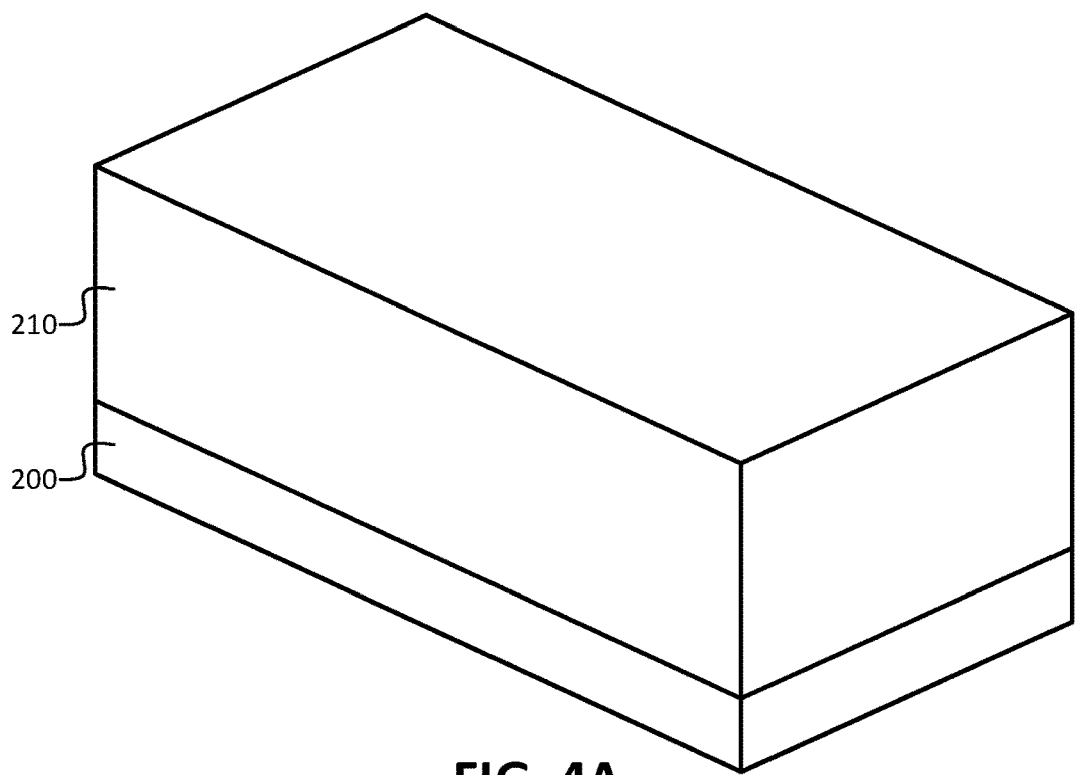
Figure 4B:
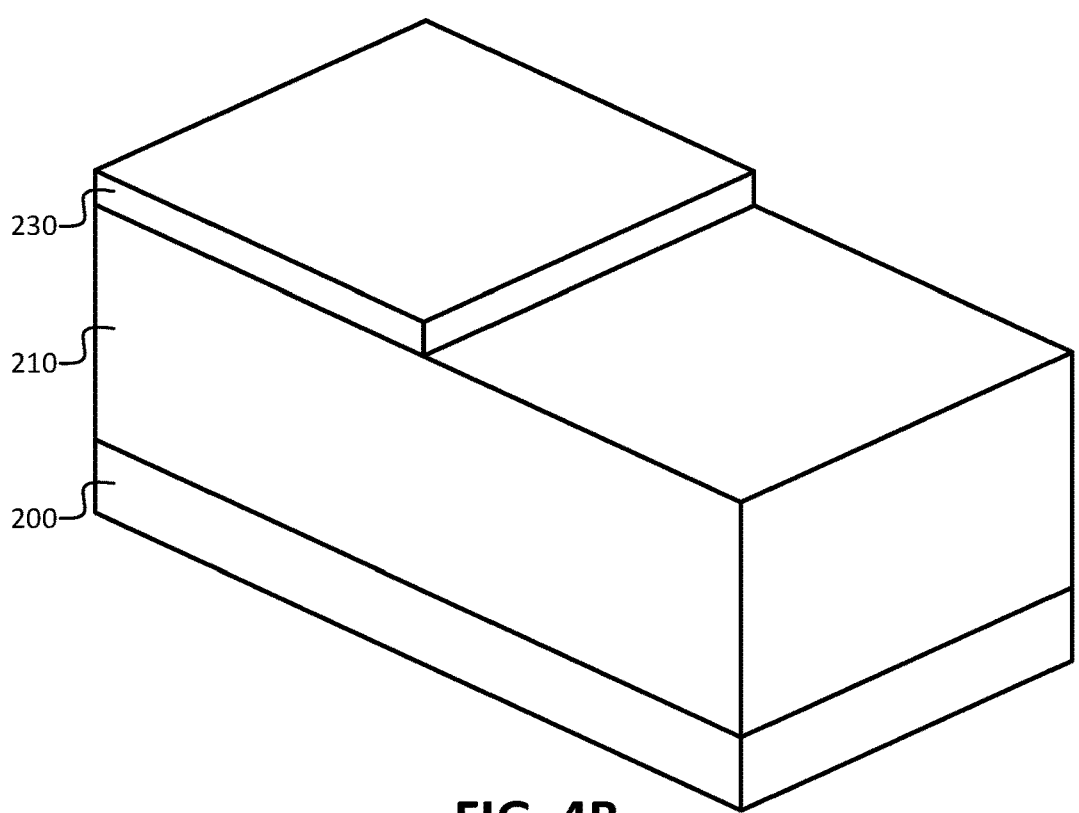
Figure 4C:
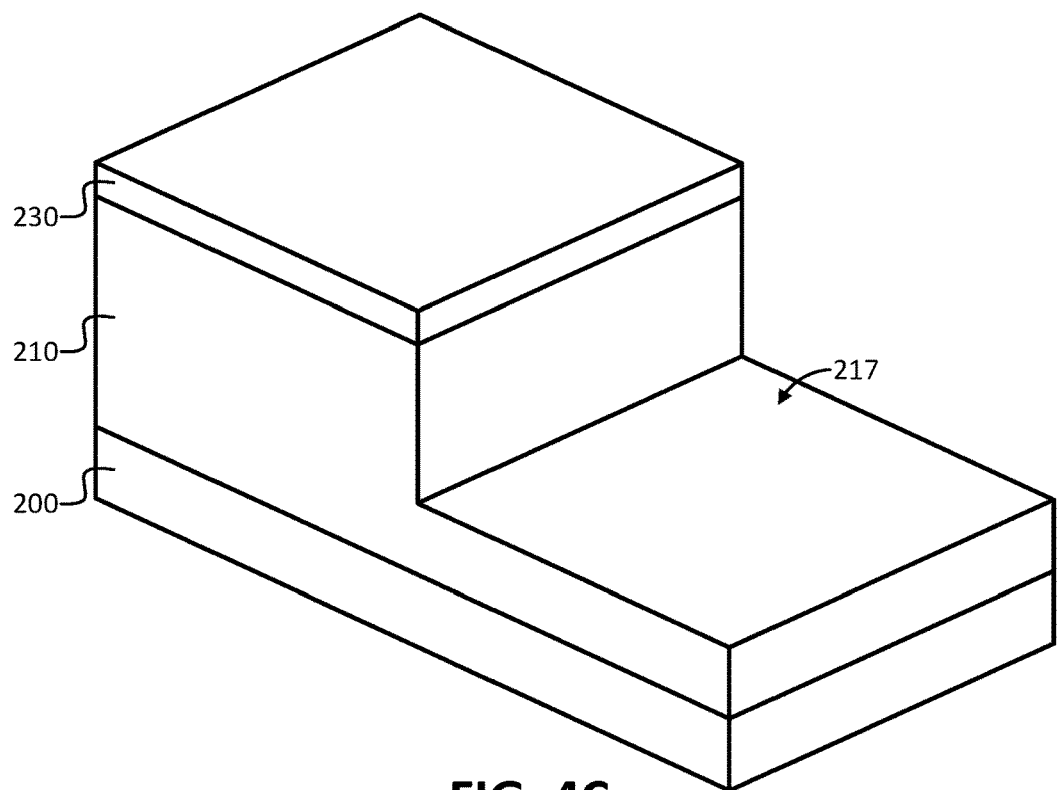
Figure 4D:
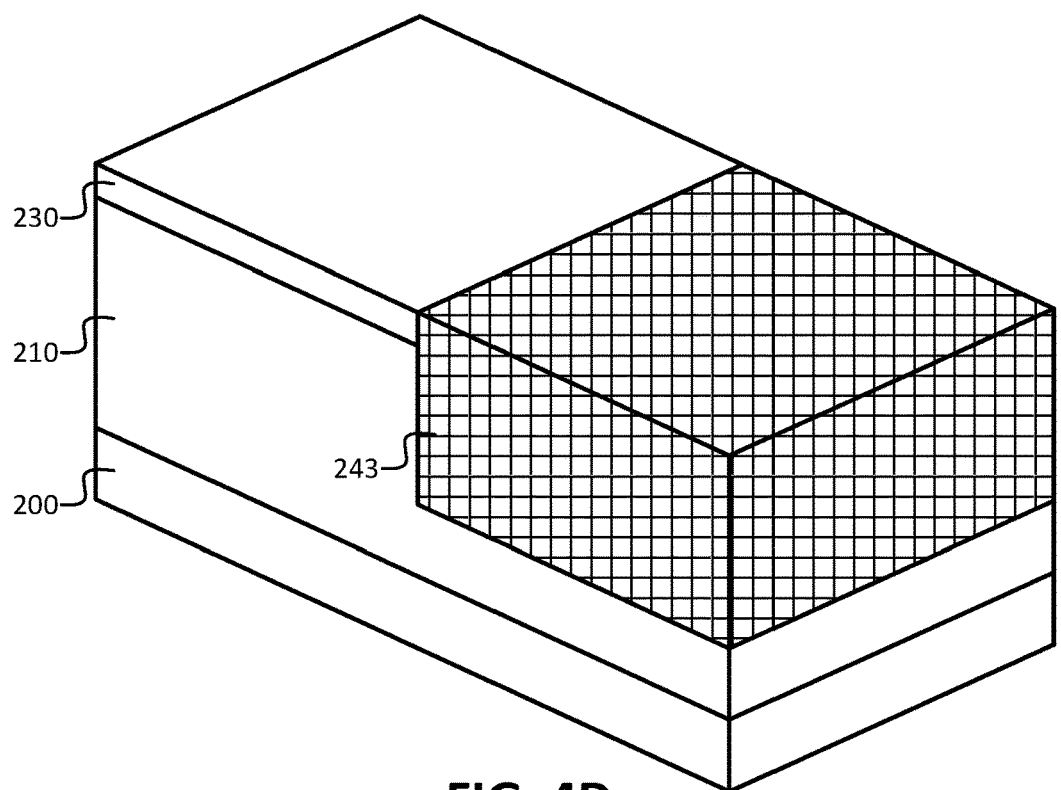

Method 100C of FIG. 1C includes a dual-well approach to forming the dual-strained fins, whereby a layer of each of the strained fins to be formed is first formed, and then the fins are formed from those layers (as opposed to using a replacement fin scheme for forming either or both sets of the fins), in accordance with some embodiments. Thus, method 100C of FIG. 1C includes forming 102 rSiGe buffer layer 210 on and/or above substrate 200 to form the example resulting structure of FIG. 4A, in accordance with some embodiments. The previous relevant description of process 102 and the structure of FIG. 2A applies equally here. Method 100C of FIG. 1C continues with forming 103 the first strained-material layer on rSiGe buffer layer 210 to form the example resulting structure of FIG. 4E, in accordance with some embodiments. The previous relevant description with respect to process 103 and first strained-material layer 240 is equally applicable here, except that layer 240 was not formed on the entirety of rSiGe buffer layer 210 (as compared to the structure of FIG. 3B). Instead, method 100C includes a dual-well approach, whereby layers of both the first and second strained materials are formed on rSiGe buffer layer 210 and those layers are then formed into fins (as opposed to utilizing a replacement fin scheme to form one or both sets of the fins). Thus, to form 103 the first strained-material layer 243 on the rSiGe buffer layer 210 as shown in FIG. 4E (where it is formed on only a portion of the rSiGe buffer layer 210), an example technique is illustrated using FIGS. 4B-E, in accordance with some embodiments. As shown in FIG. 4B, hardmask 230 (such as was previously described) was formed over a portion of rSiGe buffer layer 210 from the structure of FIG. 4A. Then, as shown in FIG. 4C, the exposed portion of the rSiGe buffer layer 210 was removed (e.g., via wet and/or dry etch processing) to form trench 217. Then, as shown in FIG. 4D, first strained-material layer 243 has been formed in trench 217. The previous relevant description with respect to first strained-material layer 240 is equally applicable to first strained-material layer 243. Then, a planarization/polish process (e.g., a CMP process) was used to form the resulting example structure of FIG. 4E. Note that the example technique described with respect to FIGS. 4B-E is provided for illustrative purposes and is not intended to be limit the present disclosure, as the structure of FIG. 4E (or a similar such structure) may be achieved using any suitable techniques.

Method 100C of FIG. 1C continues with forming 107 second strained-material layer 244 on the rSiGe buffer layer 210 to form the resulting example structure of FIG. 4F, in accordance with some embodiments. The previous relevant description with respect to process 103 is equally applicable to process 107, except that instead of forming the first strained-material layer 243, the second strained-material layer 244 is being formed. As can be understood based on this disclosure, second strained-material layer 244 will be formed into second strained-material fins 242, such as those previously described. Therefore, the previous relevant description of second strained-material fins 242 is equally applicable to second strained-material layer 244. For example, the material description is the same, the fin height (Fh) description is the same for the thickness (dimension in the Y-axis direction) of layer 244, and so forth. However, note that the material of second strained-material fins 242 is being first formed using a dual-well approach to form layer 244 and then form fins 242 therefrom, in this example embodiment, as opposed to the replacement fin scheme (as was the case for method 100A and method 100B).

FIG. 4F' illustrates a blown-out portion of FIG. 4F to illustrate variations with respect to the techniques for forming dual-strained fins as described herein, in accordance with some embodiments. The variation includes that the first strained-material fins may be formed on a first rSiGe buffer layer and the second strained-material fins may be formed on a second rSiGe buffer layer, in some embodiments. For instance, as shown in FIG. 4F', first strained-material layer 243 was formed on first rSiGe buffer layer 211, while second strained-material layer 244 was formed on second rSiGe buffer layer 213 in the example structure shown. This can be compared to the example structure of FIG. 4F, where the two layers 243 and 244 were both formed on the same rSiGe buffer layer 210. By using two different rSiGe buffer layers (such as layers 211 and 213), in some embodiments, different included Ge concentrations may be used for forming the overlying strained-material (and thus for forming the overlying strained-material fins), in some embodiments. To provide some example cases, it may be desired to form an n-MOS device that utilizes tensile-stressed Si formed on a first rSiGe buffer layer including a Ge concentration in the range of 30-40% with a co-integrated p-MOS device that utilizes compressive-stressed Ge formed on a second rSiGe buffer layer including a Ge concentration in the range of 60-70% Ge. By using different rSiGe buffer layers for the different devices, additional tunability of the materials and stresses may be achieved, in some such embodiments.

Figure 4G:
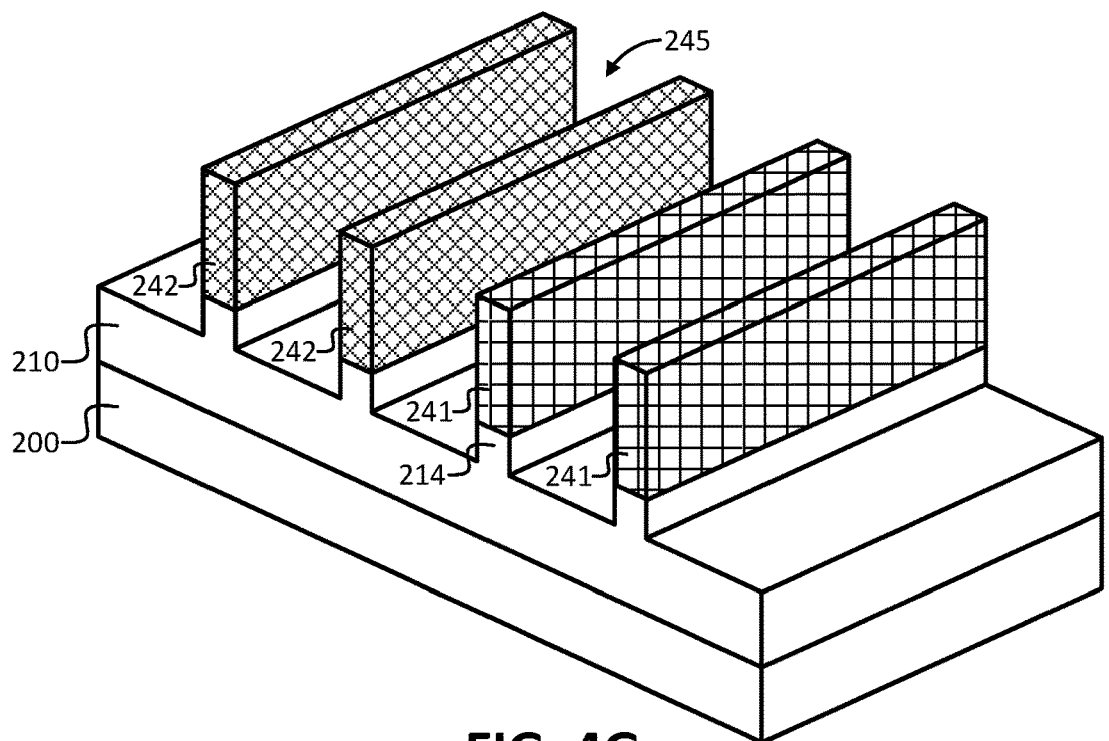
Figure 4H:
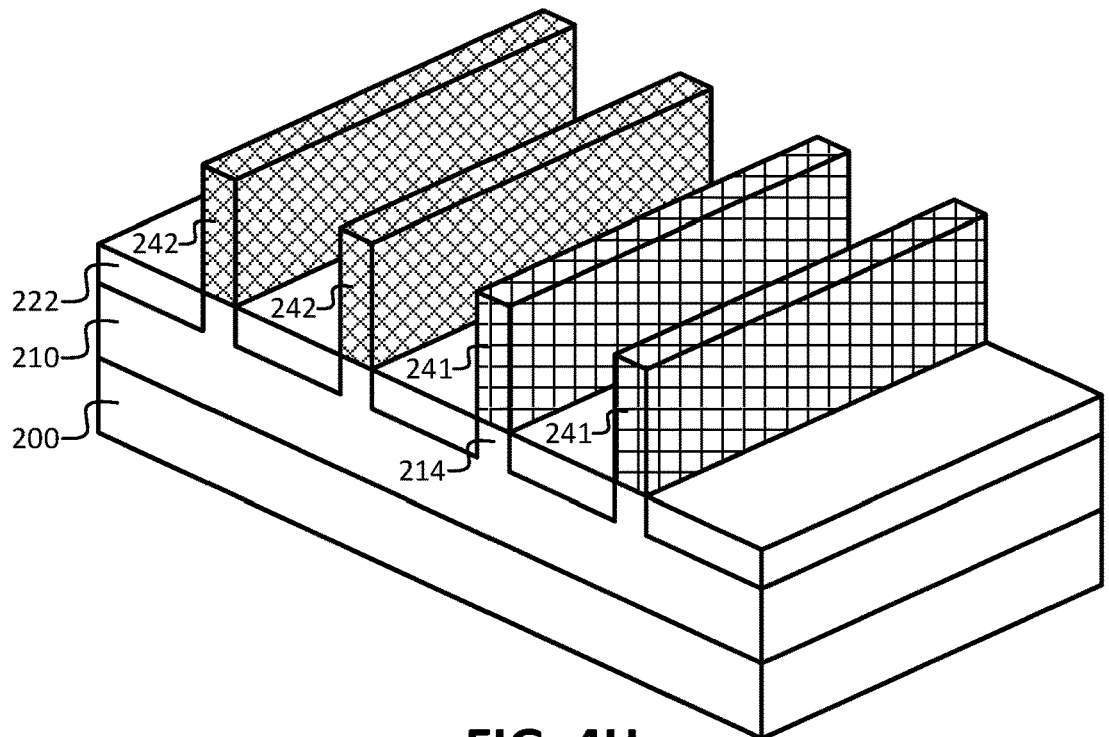

Method 100C of FIG. 1C continues with forming 109 fins 241 and 242 from the first and second strained-material layers 243 and 244, respectively, to form the example resulting structure of FIG. 4G, in accordance with some embodiments. The previous relevant description with respect to process 104 and 105 is equally applicable to process 109. For example, first and second strained-material fins 241 and 242, respectively, may be formed 109 using any suitable techniques, such as including one or more masking, patterning, lithography, and/or etching (e.g., wet and/or dry etching) processes, as can be understood based on this disclosure. Method 100C of FIG. 1C continues with forming 106 STI material 220 around the first and second strained-material fins 241 and 242 to form the example resulting structure of FIG. 2G, in accordance with some embodiments. Method 100C of FIG. 1C continues with recessing 116 the STI material 220 to expose the two sets of strained-material fins 241 and 242 as shown in FIG. 4H, in accordance with some embodiments. The previous relevant description with respect to process 116 is equally applicable here. Moreover, the previous relevant description with respect to the structure of FIG. 2H (and the features of that structure, such as first strained-material fins 241, second strained-material fins 242, and so forth) is equally applicable to the structure of FIG. 4H, as they are the same in this example case.

Figure 1D:
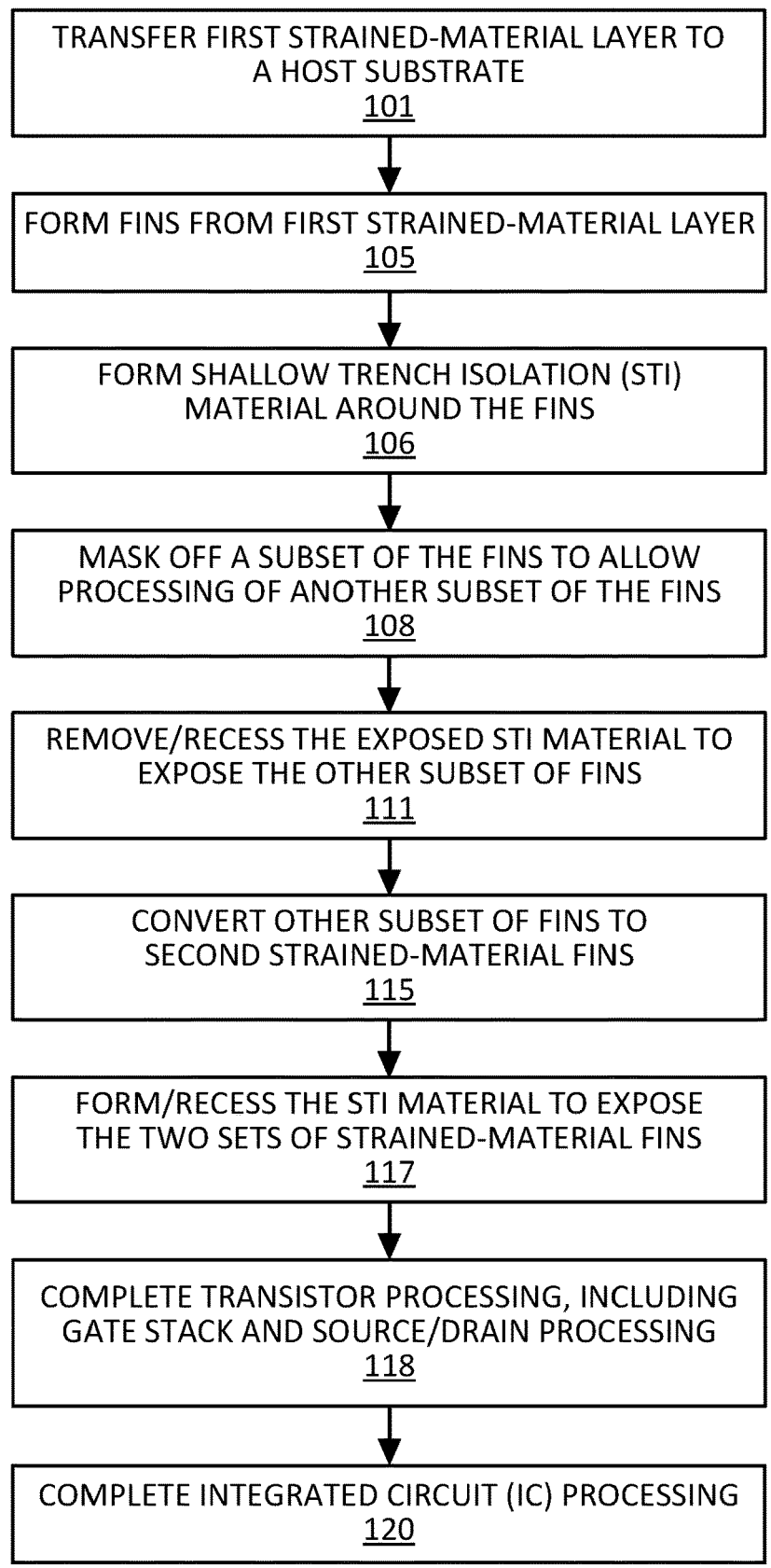
Figure 5A:
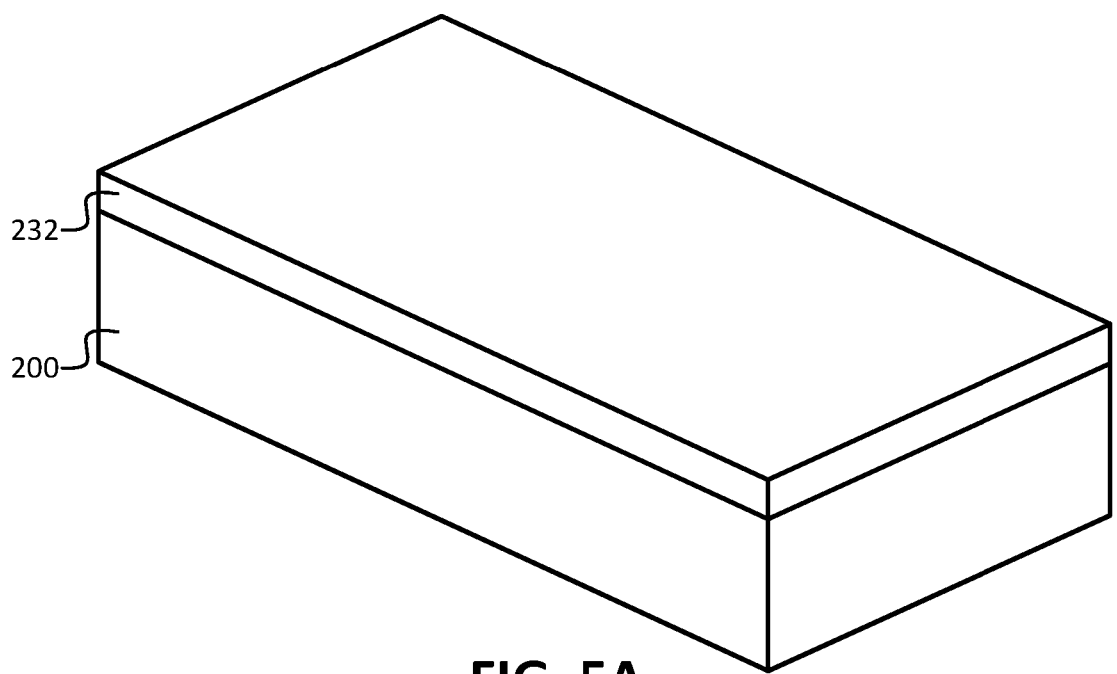
FIGS. 5A-H illustrate example IC structures formed when carrying out the method of FIG. 1D, specifically up to the point that dual-strained fins have been formed, in accordance with some embodiments.
Figure 5B:
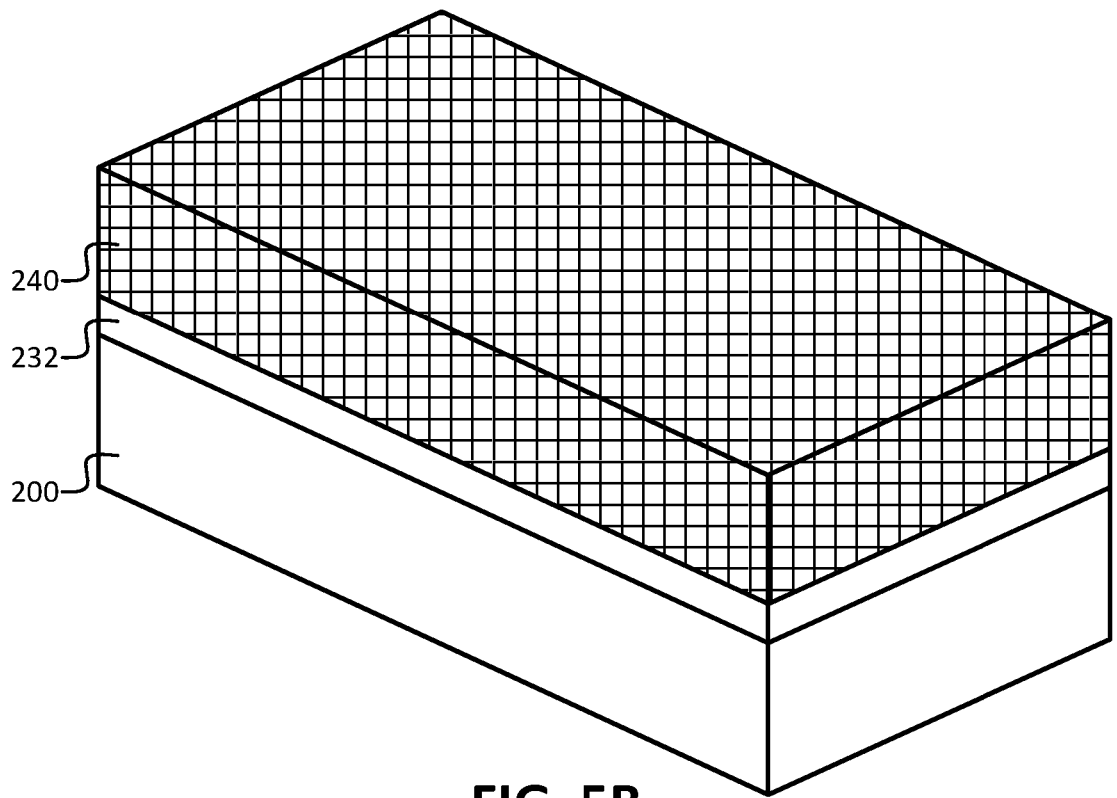

Method 100D of FIG. 1D includes an approach whereby the first strained-material layer is formed using a transfer wafer/substrate and then transferred (e.g., bonded) to a host substrate, whereby all or some of the transfer wafer/substrate is removed to allow processing using the first strained-material layer. In addition, method 100D of FIG. 1D illustrates techniques for converting one set of strained-material fins into another set of strained-material fins (e.g., using cladding and condensation techniques, as will be described herein). Thus, method 100D of FIG. 1D includes transferring 101 a first strained-material layer to a host substrate, in accordance with some embodiments. As shown in FIG. 5A, the host substrate in this example embodiment includes substrate 200 and insulating layer 232, to enable the formation of a stressed XOI structure as shown in FIG. 5B, for example. The previous relevant description with respect to substrate 200 is equally applicable here. In some embodiments, insulating layer 232 may be formed on substrate 200 using any suitable techniques as will be apparent in light of this disclosure, such as using any of the techniques described herein (e.g., CVD, PVD, ALD), for example. In some embodiments, insulating layer 232 may include any suitable electrically insulating material, such as one or more oxide (e.g., silicon dioxide), nitride (silicon nitride), and/or dielectric materials. In some embodiments, insulating layer 232 may include any suitable thickness (dimension in the Y-axis direction), such as a thickness in the range of 10 nm to 2 microns (e.g., 10-800 nm), or any other suitable thickness as will be apparent in light of this disclosure.

In some embodiments, the transfer process 101 of first strained-material layer 240 to form the example resulting structure of FIG. 5B may include any suitable techniques, such as first forming layer 240 on a transfer wafer (e.g., on a rSiGe buffer layer as variously described herein or on another suitable group IV material layer/substrate), inverting the transfer wafer and bonding it to the structure of FIG. 5A, and then removing the remainder of the transfer wafer to leave first strained-material layer 240 as shown in FIG. 5B, for example. The previous relevant description with respect to first strained-material layer 240 is equally applicable here, except that layer 240 was transferred to the structure of FIG. 5A in this example case as opposed to being grown on the underlying structure (as was the case in method 100B to form the structure of FIG. 3B).

Figure 5C:
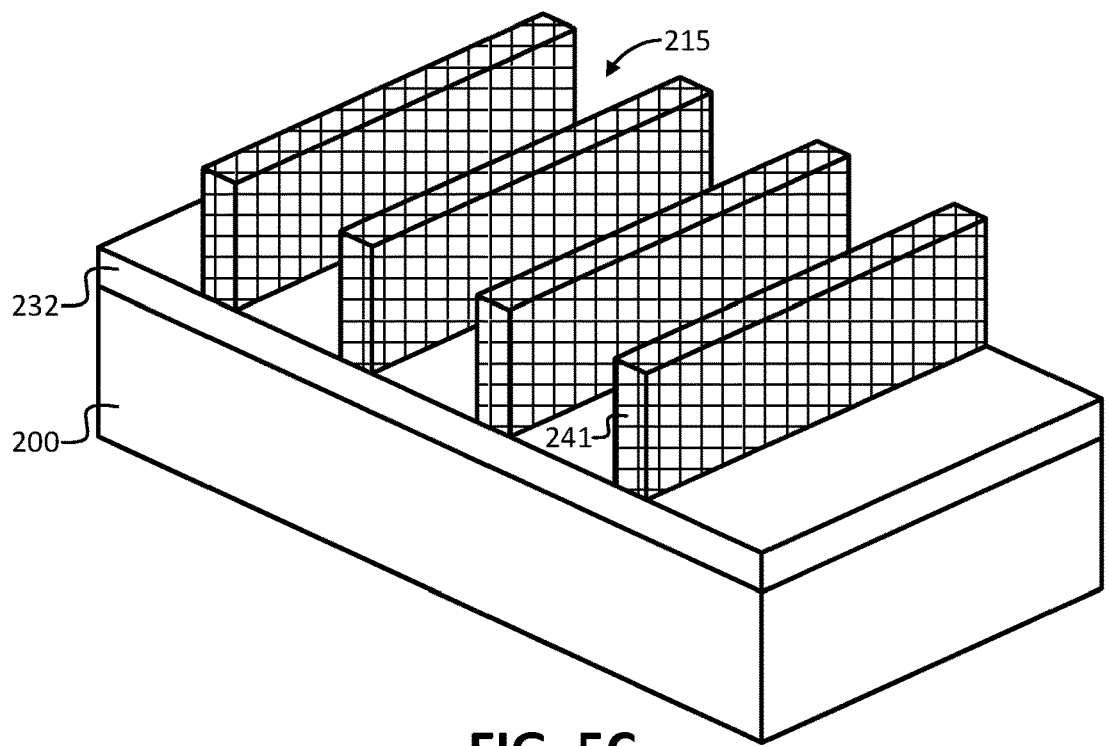
Figure 5D:
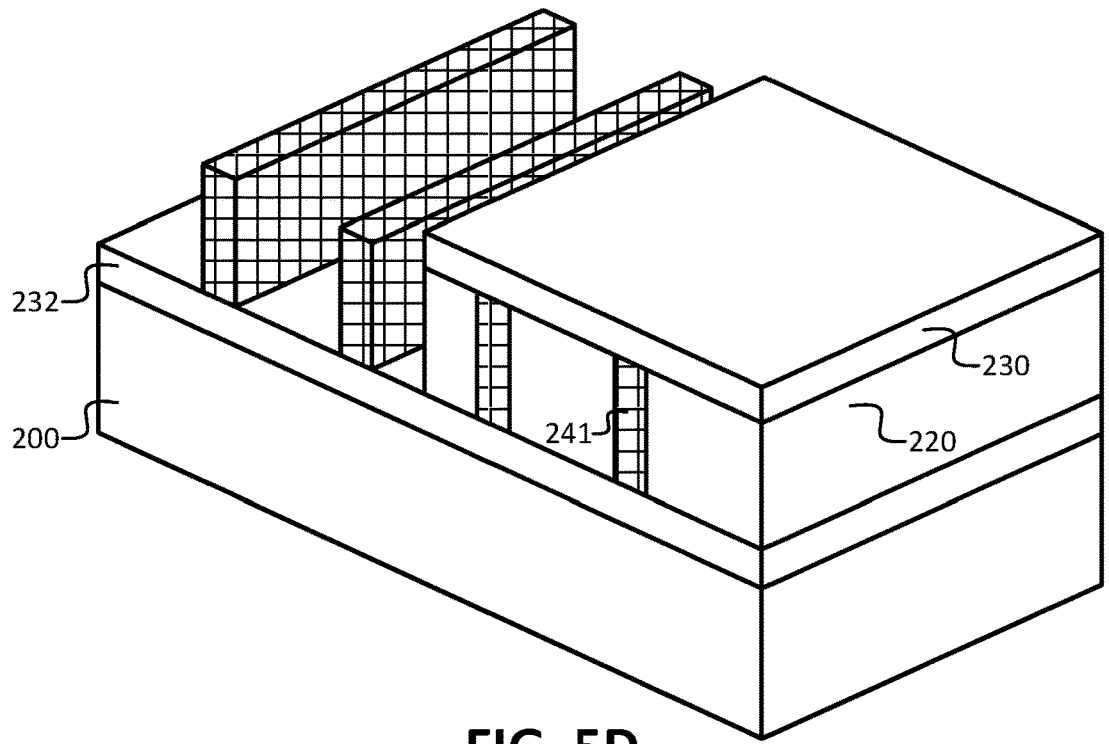
Figure 5E:
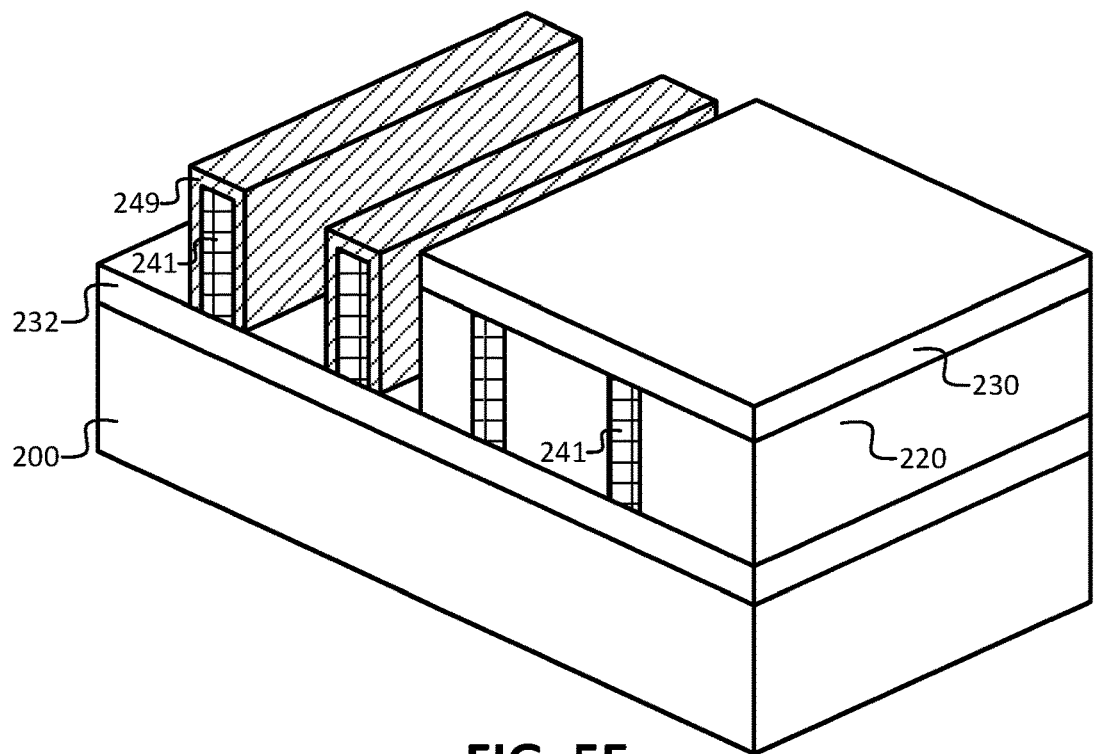

Method 100D of FIG. 1D continues with forming 105 fins 241 from the first strained-material layer 240 to form the example resulting structure of FIG. 5C, in accordance with some embodiments. The previous relevant description with respect to process 105 is equally applicable here. Method 100D of FIG. 1D continues with forming 106 STI material 220 around first strained-material fins 241, masking off 108 a subset of the fins (a subset of the first-strained material fins 241, in this example case) to allow processing of another subset of the fins (another subset of fins 241, in this example case), and removing or recessing 111 the exposed STI material 220 to expose the other subset of fins, thereby forming the example resulting structure of FIG. 5D, in accordance with some embodiments. The previous relevant description with respect to processes 106 and 108, as well STI material 220 and hardmask 230 is equally applicable here. However, note that the STI material 220 is being formed around fins 241 in this example case as opposed to the STI material 220 being formed around fins 212 in the example case of method 100A and FIG. 2C. Also note that hardmask 230 is first formed on the right-most two fins in the example structure of FIG. 5D (as opposed to first forming hardmask 230 on the left-most two fins in the example structure of FIG. 2D), to allow for the end structures of FIGS. 5H and 2H to be similar, for ease of illustration. The previous relevant description with respect to process 116 is equally applicable to process 111, except that only the exposed STI material 220 is being processed and in this example case, it was completely removed to fully expose the left-most two fins 241 as shown in FIG. 5D.

Figure 5F:
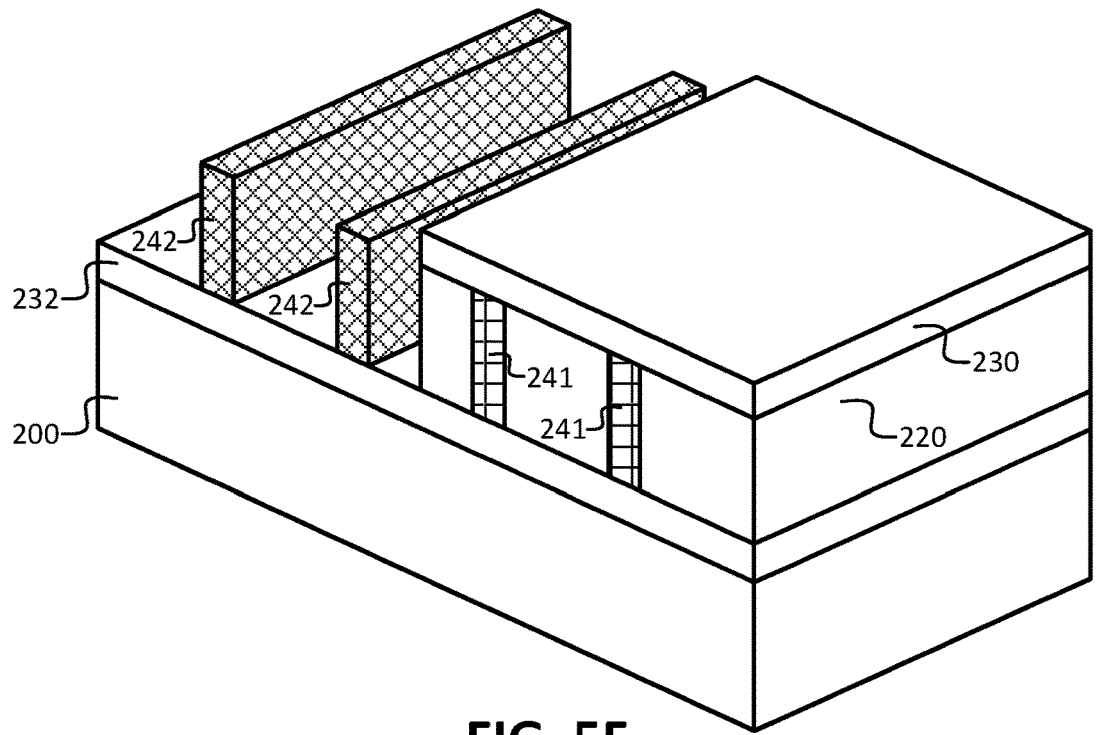
Figure 5G:
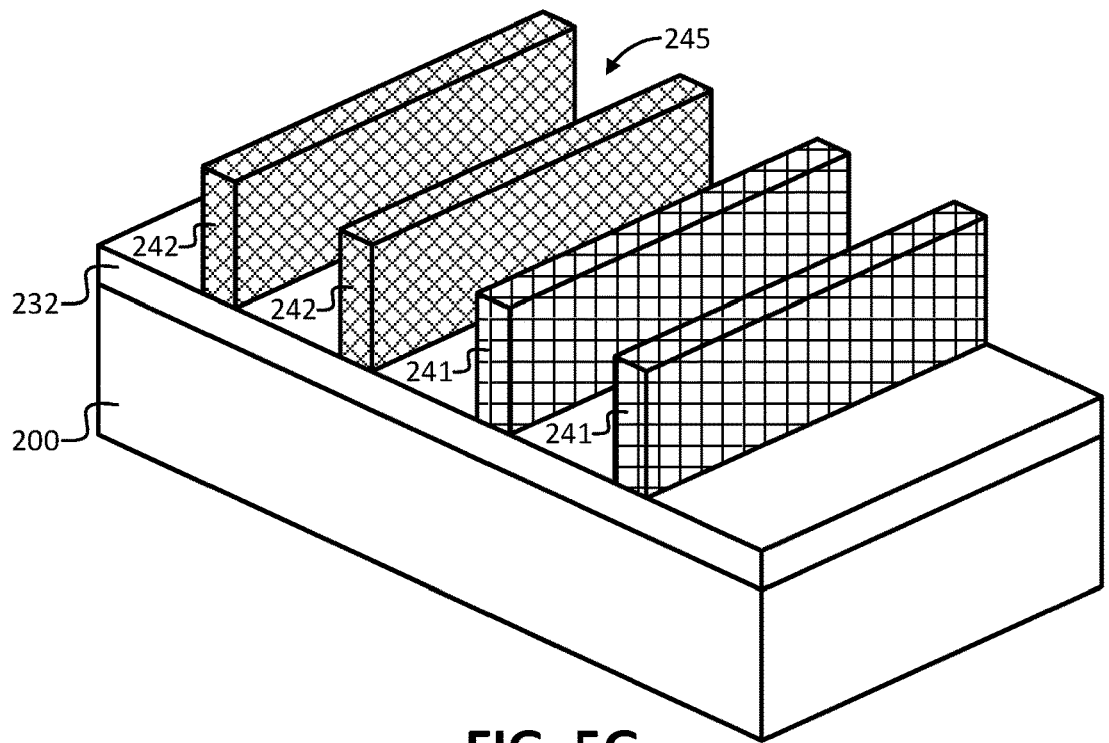

Method 100D of FIG. 1D continues with converting 115 the other subset of first strained-material fins 241 (the exposed fins) to second strained material fins 242, thereby forming the example resulting structure of FIG. 5F, in accordance with some embodiments. In some embodiments, converting process 115 may include cladding the exposed subset of first strained-material fins 241 (here, the left-most two fins in the structure) with material layer 249 as shown in the example structure of FIG. 5E and then performing condensation processing (e.g., oxidation) to condense the cladding material layer 249 into the clad fins, thereby forming second strained-material fins 242 as shown in FIG. 5F, for example. In some such embodiments, cladding material layer 249 may include any suitable material, such as Si, SiGe, or Ge, for example.

Figure 5H:
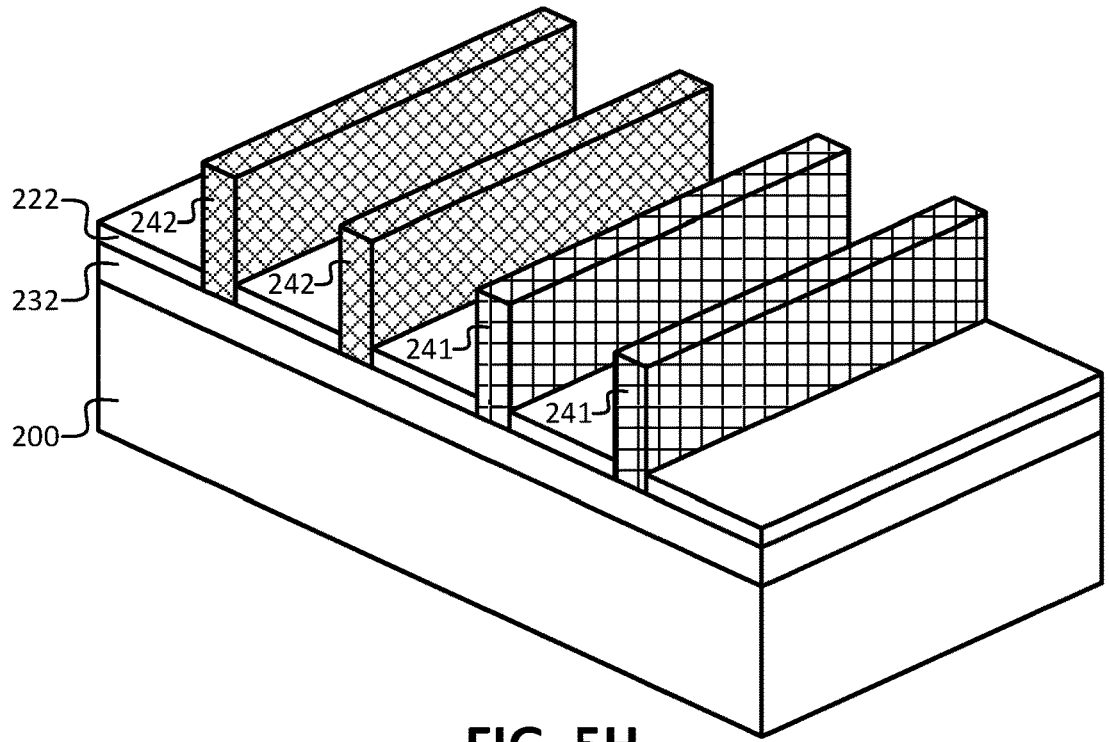

Method 100D of FIG. 1D continues with forming and/or recessing 117 the STI material to expose the two sets of strained-material fins 241 and 242 as shown in FIG. 5H, in accordance with some embodiments. In this example embodiment, STI material 220 and hardmask 230 were removed from the first strained-material fins 241 to form the example structure of FIG. 5G. Then, new STI material was formed and recessed to form STI layer 222. The previous relevant description with respect to STI layer 222 is equally applicable here. However, in some embodiments, STI material 220 may remain and additional STI material may be formed between where the original STI material 220 was not located to form the example structure of FIG. 5H, for example. Note that the difference between the structure of FIG. 5H and the structure of FIG. 2H is that the former was formed using a transfer and convert approach, such that the rSiGe layer used to form the first strained material is absent in the end structure (e.g., rSiGe buffer layer 210 is not present in the end structure of FIG. 5H), whereas the latter was formed on the rSiGe buffer layer 210 such that the layer 210 is present in the end structure, as can be understood based on this disclosure. Regardless, both of the structures shown in FIGS. 5H and 2H include dual-strained fins 241 and 242. Therefore, the previous relevant description with respect to the structure of FIG. 2H (and the features of that structure, such as first strained-material fins 241, second strained-material fins 242, and so forth) is equally applicable to the structure of FIG. 5H. Numerous variations on the techniques of forming dual-strained fins will be apparent in light of this disclosure.

Methods 100A-D of FIGS. 1A-D continue with completing 118 transistor processing to form one or more transistors, where the additional processing includes gate stack and source/drain (S/D) processing, in accordance with some embodiments. Continuing with the example structure of FIG. 6A (from the example structure of FIGS. 2H/3H/4H), the processing is described herein in the context of a gate last transistor fabrication flow, where the processing includes forming a dummy gate stack, performing the S/D processing, and then forming the final gate stack after the S/D regions have been processed. In other embodiments, the techniques may be performed using a gate first process flow. In such example embodiments, a dummy gate stack need not be formed, as the final gate stack can be formed in the first instance. However, the description of the continued processing 118 will be described using a gate last process flow, to allow for such a gat last flow (which may include additional processes) to be adequately described. Regardless, the end structure will include the end gate stack, as will be apparent in light of this disclosure.

Figure 6A:
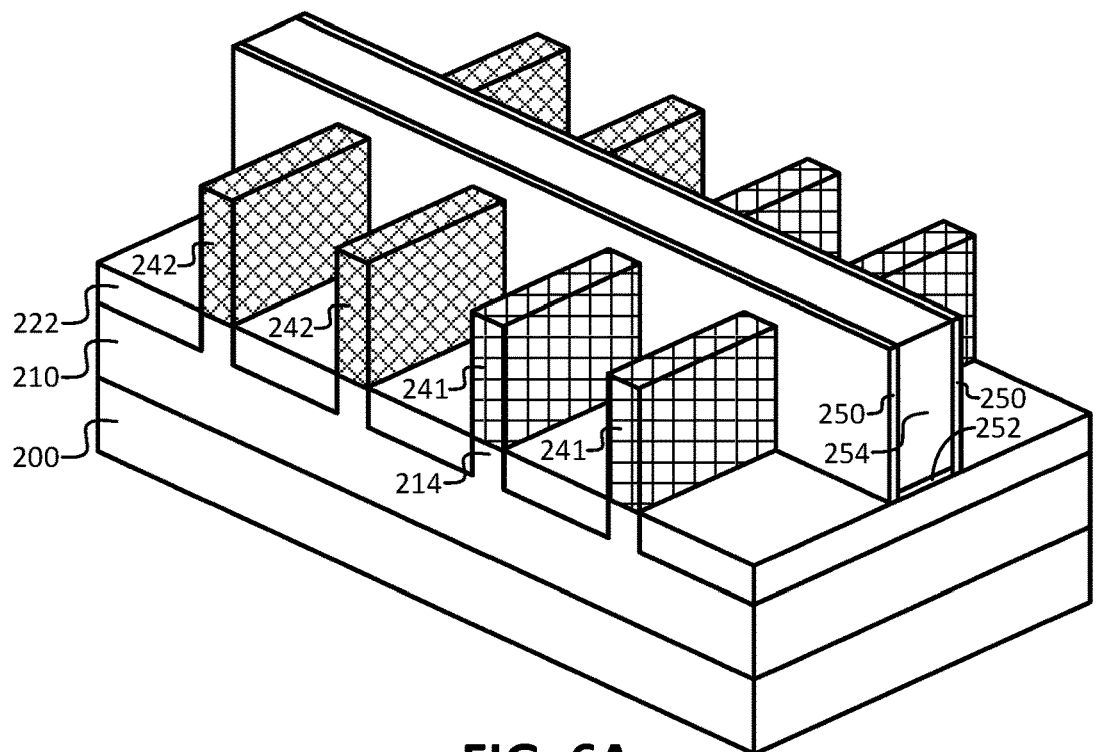
FIGS. 6A-D illustrate example IC structures formed when continuing the methods of FIGS. 1A-D, specifically continuing after the dual-strained fins have been formed and completing transistor processing, in accordance with some embodiments.

As shown in the example structure of FIG. 6A, the processing continues with forming a dummy gate stack, including dummy gate dielectric 252 and dummy gate (or dummy gate electrode) 254, in accordance with some embodiments. As described above, the formation of the dummy gate stack is optional, because it need not be performed in all embodiments (such as those employing a gate first process flow). In this example embodiment, dummy gate dielectric 252 (e.g., dummy oxide material) and dummy gate (or dummy gate electrode) 254 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and can help with replacement gate processing, for example. As can be understood based on this disclosure, the dummy gate stack (and spacers 250) help define the channel region and source/drain (S/D) regions of each fin 240, where the channel region is below the dummy gate stack (as it will be located below the final gate stack), and the S/D regions are on either side of the channel region (e.g., not below the dummy gate stack). Note that because the IC structures are being described in the context of forming finned transistors, the final gate stack will also be adjacent to either side of the fin, as the gate stack will reside along three walls of the finned channel regions, in some such embodiments. Formation of the dummy gate stack may include depositing the dummy gate dielectric material 252 and dummy gate (or dummy gate electrode) material 254, patterning the dummy gate stack, depositing gate spacer material 250, and performing a spacer etch to form the structure shown in FIG. 6A, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate stack (which may also be formed over spacers 250) to protect the dummy gate stack during subsequent processing, for example.

Figure 6B:
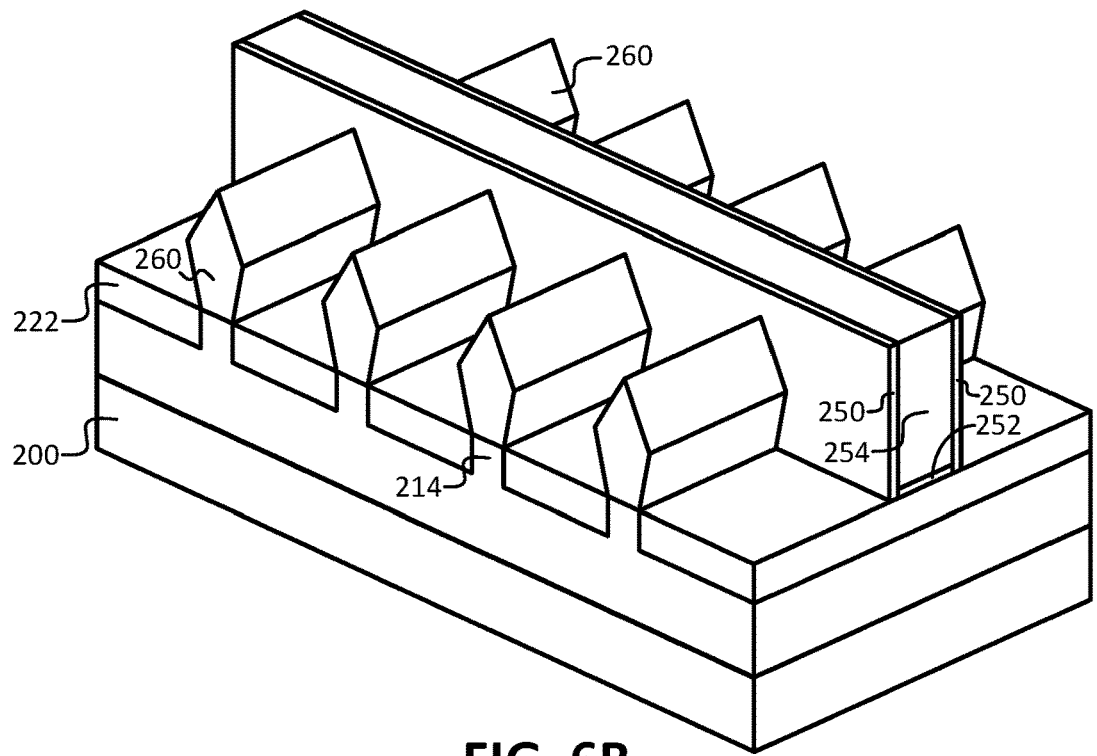
Figure 6C:
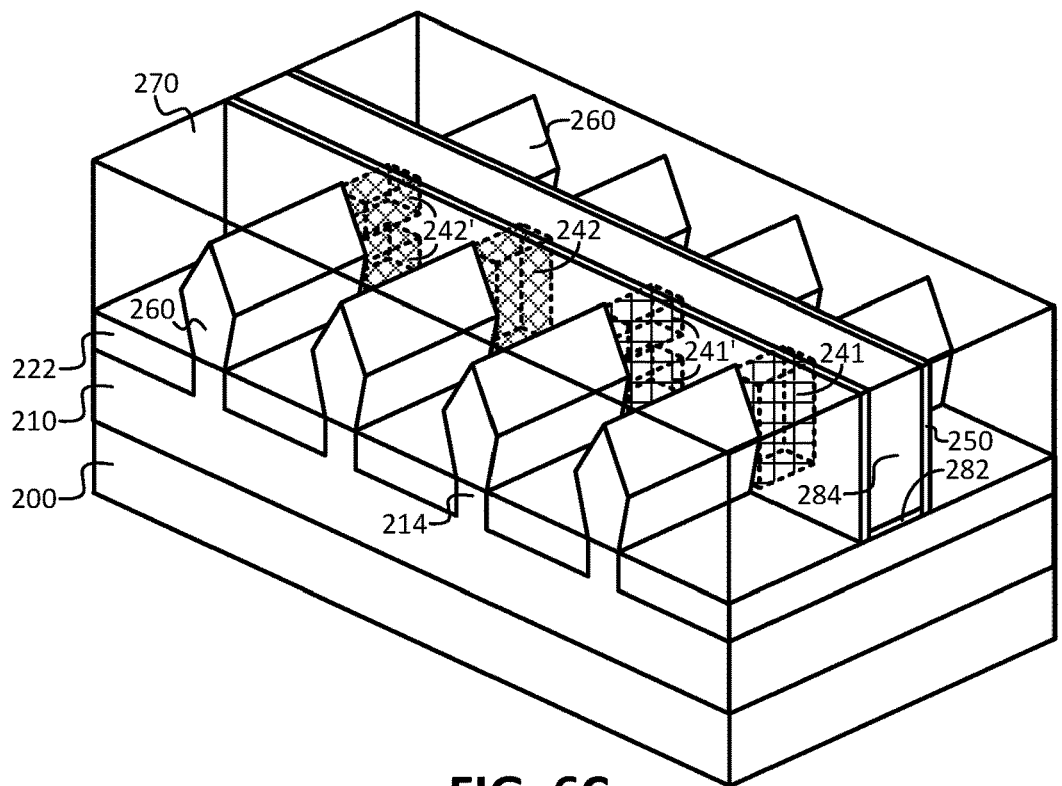

Continuing from the example structure of FIG. 6A, completing 118 the transistor processing includes performing source/drain (S/D) processing to form the example resulting structure of FIG. 6B, in accordance with some embodiments. The S/D regions 260, in some embodiments, may be formed using any suitable techniques, such as masking regions outside of the S/D regions to be processed, etching at least a portion of the exposed fins 241 and 242 from the structure of FIG. 6A, and forming/depositing/growing the S/D regions 260 (e.g., using any suitable techniques, such as CVD, MOCVD, ALD, PVD, MBE), for example. However, in some embodiments, the strained-material fins 241 and 242 need not be completely removed, but they may remain and be doped and/or cladded and/or have some other suitable processing performed to convert them into suitable S/D regions, for example. In this example embodiment, as the material of the S/D regions 260 is replacement material, there is a distinct interface between the underlying sub-fin portions 214 from the rSiGe buffer layer fins and S/D regions 260, as shown in FIG. 6B. In some embodiments, one or more of the S/D regions 260 may have a multilayer structure including multiple material layers, for example. In some embodiments, one or more of the S/D regions 260 may include grading (e.g., increasing and/or decreasing) the content/concentration of one or more materials in some or all of the region(s).

In some embodiments, the S/D regions may be formed one polarity at a time, such as performing processing for one of n-type and p-type S/D regions, and then performing processing for the other of the n-type and p-type S/D regions. In some embodiments, the S/D regions may include any suitable material, such as group IV semiconductor material (e.g., Si, SiGe, Ge) and/or any other suitable material, as will be apparent in light of this disclosure. In some embodiments, the S/D regions may include any suitable doping scheme, such as including suitable n-type and/or p-type dopant. To provide some examples, in embodiments, where corresponding S/D regions on either side of a channel region (e.g., on either side of the gate stack) are to be used for a MOSFET device, the S/D regions may include the same type of dopants (e.g., where both are p-type doped or both are n-type doped). Specifically, for an n-MOS device, the included S/D regions include semiconductor material that is n-type doped, and for a p-MOS device, the included S/D regions include semiconductor material that is p-type doped. Numerous transistor S/D configurations and variations will be apparent in light of this disclosure.

Continuing from the example structure of FIG. 6B, completing 118 the transistor processing includes performing gate stack processing to form the example resulting structure of FIG. 6C, in accordance with some embodiments. As shown in FIG. 6C, the processing in this example embodiment included depositing interlayer dielectric (ILD) layer 270 on the structure of FIG. 6B, followed by optional planarization and/or polishing to reveal the dummy gate stack. Note that ILD layer 270 is shown as transparent in the example structure of FIG. 6C to allow for the underlying features to be seen (and the ILD layer 270 may actually be transparent or translucent at such a small scale); however, the present disclosure is not intended to be so limited. In some embodiments, the ILD layer 270 may include any suitable electrical insulator, dielectric, oxide (e.g., silicon oxide), and/or nitride (e.g., silicon nitride) material, as will be apparent in light of this disclosure. The gate stack processing, in this example embodiment, continued with removing the dummy gate stack (including dummy gate 254 and dummy gate dielectric 252) to allow for the final gate stack to be formed. Recall that in some embodiments, the formation of the final gate stack, which includes gate dielectric layer 282 and gate (or gate electrode) 284, may be performed using a gate first flow (e.g., an up-front hi-k gate process). In such embodiments, the final gate processing may have been performed prior to the S/D processing, for example. However, in this example embodiment, the gate stack is formed using a gate last flow (also called a replacement gate or replacement metal gate (RMG) process). In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric layer 282 and gate 284 as shown in FIG. 6C, in accordance with some embodiments.

Note that when the dummy gate is removed, the channel region of strained-material fins 241 and 242 (that were covered by the dummy gate) are exposed to allow for any desired processing of the channel regions of the fins. Such processing of the channel regions may include various different techniques, such as removing and replacing the channel region with replacement material, doping the channel region of the fin as desired, forming the fin into one or more nanowires (or nanoribbons) for a gate-all-around (GAA) transistor configuration, cleaning/polishing the channel region, and/or any other suitable processing as will be apparent in light of this disclosure. For instance, finned channel regions 241 and 242 are illustrated (which are the channel regions of the right-most finned structure and the second-from-the-left finned structure, respectively), which may be from the original fin structures formed in FIGS. 2H/3H/4H, for example. However, in some embodiments, those finned channel regions may be modified from the original fins, such as doping the channel regions with a desired suitable n-type or p-type dopant, for example. To provide another example, nanowire channel regions 241' and 242' (which are the channel regions of the second-from-the-right structure and the left-most structure) may have been formed after the dummy gate was removed and the channel regions of the fins were exposed, by converting a multilayer finned structure into the two nanowires (or nanoribbons) shown in each channel region 241' and 242', using any suitable techniques, for example. Although nanowire channel regions 241' and 242' each include two nanowires (or nanoribbons), a nanowire (or nanoribbon or GAA) transistor formed using the techniques disclosed herein may include any number of nanowires (or nanoribbons) such as 1, 2, 3, 4, 5, 6, 7, 8, 9, 10, or more, depending on the desired configuration.

As can be understood based on this disclosure, the channel region may be at least considered to be below the gate stack, in some embodiments. For instance, in the case of a finned transistor configuration, the channel region may be below and between the gate stack, as the gate stack may be formed on three sides of the finned structure, as is known in the art. Further, in the case of a nanowire (or nanoribbon or GAA) transistor configuration, the gate stack may substantially (or completely) surround each nanowire/nanoribbon in the channel region. Further still, in the case of a planar transistor configuration, the gate stack may simply be above the channel region. In some embodiments, the channel region may include group IV semiconductor material (e.g., Si, SiGe, Ge), for example, such as the material described herein with reference to fins 241 and 242. In some embodiments, the channel region of a given transistor may be doped (e.g., with any suitable n-type and/or p-type dopants) or intrinsic/undoped, depending on the particular configuration. In some embodiments, a given channel region may be tensile strained or compressive strained. As previously described, tensile-strained channel regions can be used to benefit n-MOS devices (e.g., to increase charge carrier mobility), while compressive-strained channel regions can be used to benefit p-MOS devices (e.g., to increase charge carrier mobility). Note that the S/D regions are adjacent to either side of the channel region, as can be seen in FIG. 6C. In other words, the channel region is between corresponding S/D regions. Also note that the configuration/geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor.

Continuing with the example structure of FIG. 6C, after the dummy gate has been removed and any desired channel region processing has been performed, the final gate stack can be formed, in accordance with some embodiments. In this example embodiment, the final gate stack includes gate dielectric layer 282 and gate (or gate electrode) 284, as shown in FIG. 6C. The gate dielectric layer 282 may include, for example, any suitable oxide (such as silicon dioxide), high-k gate dielectric material, and/or any other suitable material as will be apparent in light of this disclosure. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric layer 282 to improve its quality when high-k material is used. The gate 284 (or gate electrode) may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric layer 282 and/or gate 284 may include a multilayer structure of two or more material layers, for example. In some embodiments, gate dielectric layer 282 and/or gate 284 may include grading (e.g., increasing and/or decreasing) the content/concentration of one or more materials in at least a portion of the feature(s). One or more additional layers may also be present in the final gate stack, in some embodiments, such as one or more work function layers or other suitable layers, for example. Note that although gate dielectric layer 282 is only shown below gate 284 in the example embodiment of FIG. 6C, in other embodiments, the gate dielectric layer 282 may also be present on one or both sides of gate 284, such that the gate dielectric layer 282 is between gate 284 and one or both spacers 250, for example. Numerous different gate stack configurations will be apparent in light of this disclosure.

In some embodiments, the length of gate 284 (e.g., the dimension between spacers 250 in the Z-axis direction), which may be the same as or approximate the channel length (e.g., the gate length may be approximately longer than the channel length due to potential diffusion of dopant from the S/D regions into the channel region), may be any suitable length as will be apparent in light of this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length may be less than a given threshold, such as less than 100, 50, 40, 30, 25, 20, 15, 10, 8, or 5 nm, or less than some other suitable threshold as will be apparent in light of this disclosure. In some embodiments, the techniques enable maintaining a desired device performance when scaling to such low thresholds, such as sub-50, sub-40, sub-30, or sub-20 nm thresholds, as can be understood based on this disclosure.

Figure 6D:
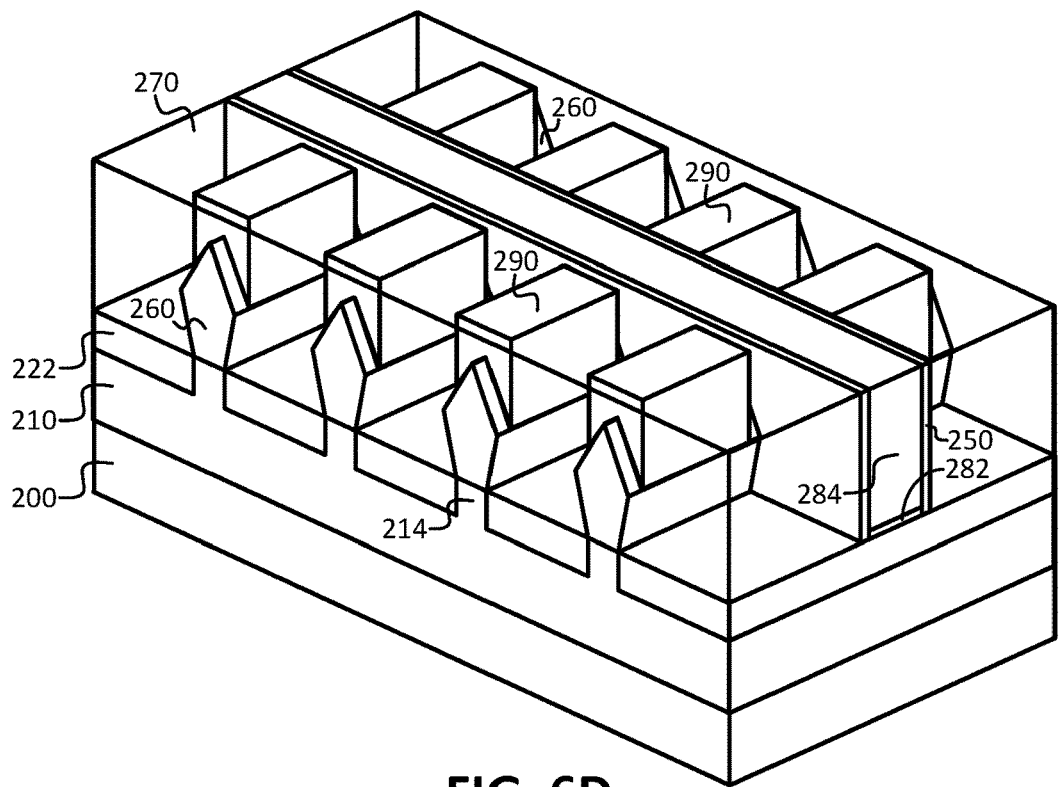

Continuing from the example structure of FIG. 6C, completing 118 the transistor processing can include performing S/D contact processing to form the example resulting structure of FIG. 6D, in accordance with some embodiments. As shown in FIG. 6D, S/D contacts 290 were formed to make contact to each of the S/D regions 260, in this example embodiment. In some embodiments, S/D contacts 290 may be formed using any suitable techniques, such as forming contact trenches in ILD layer 270 over the respective S/D regions 260 and depositing metal or metal alloy (or other suitable electrically conductive material) in the trenches. In some embodiments, S/D contact 290 formation may include silicidation, germinidation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 260 and its corresponding S/D contact 290, such as a relatively highly doped (e.g., degenerately doped with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the material and/or dopant concentration of the corresponding S/D region, for example.

After the transistor processing has been completed 118 (and/or while it is being completed), general integrated circuit (IC) processing 120 may occur as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes 101-120 of methods 100A-D in FIGS. 1A-D are shown in a particular order for ease of description. However, one or more of the processes may be performed in a different order or may not be performed at all (and thus be optional), in accordance with some embodiments. For example, forming a dummy gate is an optional process that need not be performed in embodiments employing a gate first process flow. Numerous variations on methods 100A-D and the techniques described herein will be apparent in light of this disclosure. Recall that the techniques may be used to form one or more transistor devices including tensile-strained n-MOS devices, compressive-strained p-MOS devices, and/or CMOS circuits including both tensile-strained n-MOS devices and compressive-strained p-MOS devices, for example. In addition, the techniques may be used to form transistor devices include a multitude of configurations, such as planar devices, finned or FinFET devices (e.g., dual-gate or tri-gate devices), and nanowire (or nanoribbon or GAA) devices, to provide a few examples. Numerous variations and configurations will be apparent in light of this disclosure.

Example System

Figure 7:
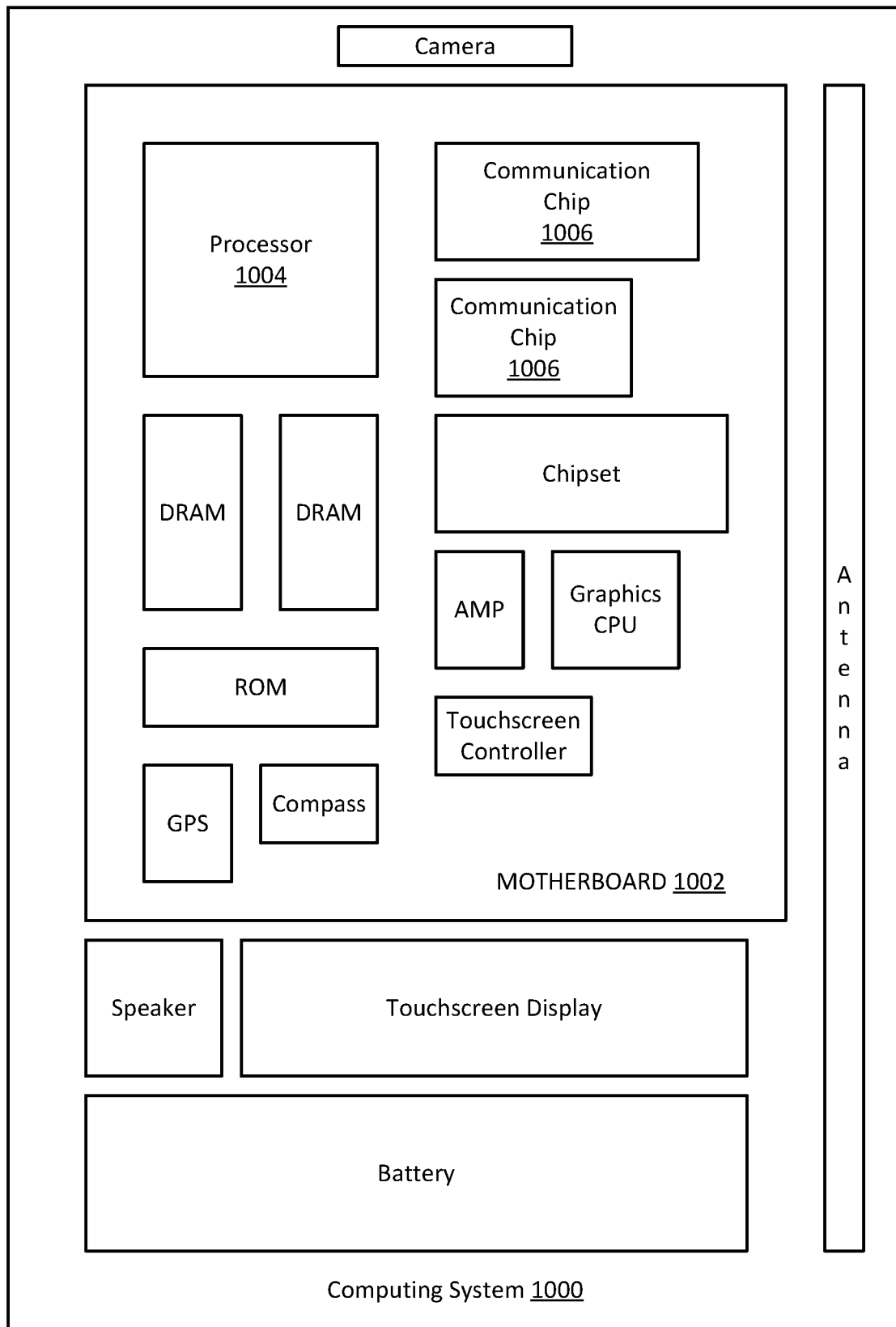
FIG. 7 illustrates a computing system implemented with integrated circuit structures and/or transistor devices formed using the techniques disclosed herein, in accordance with some embodiments of the present disclosure.

FIG. 7 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit (IC) including: a substrate; a first transistor above the substrate and including a first gate, a first channel region below the first gate and including tensile-strained semiconductor material, and first source and drain (S/D) regions adjacent the first channel region and including n-type doped semiconductor material; and a second transistor above the substrate and including a second gate, a second channel region below the second gate and including compressive-strained semiconductor material, and second source and drain (S/D) regions adjacent the second channel region and including p-type doped semiconductor material.

Example 2 includes the subject matter of Example 1, wherein the compressive-strained semiconductor material includes at least 40 percent more germanium (Ge) content by atomic percentage than the tensile-strained semiconductor material.

Example 3 includes the subject matter of Example 1 or 2, wherein the wherein the compressive-strained semiconductor material includes at least 60 percent more germanium (Ge) content by atomic percentage than the tensile-strained semiconductor material.

Example 4 includes the subject matter of any of Examples 1-3, wherein the tensile-strained semiconductor material includes silicon (Si).

Example 5 includes the subject matter of any of Examples 1-3, wherein the tensile-strained semiconductor material includes silicon germanium (SiGe).

Example 6 includes the subject matter of any of Examples 1-5, wherein the compressive-strained semiconductor material includes silicon germanium (SiGe).

Example 7 includes the subject matter of any of Examples 1-5, wherein the compressive-strained semiconductor material includes germanium (Ge).

Example 8 includes the subject matter of any of Examples 1-7, wherein the compressive-strained semiconductor material includes at least 0.5 gigapascals (GPa) of compressive stress.

Example 9 includes the subject matter of any of Examples 1-8, wherein the tensile-strained semiconductor material includes at least 0.5 gigapascals (GPa) of tensile stress.

Example 10 includes the subject matter of any of Examples 1-9, further including an intervening layer between the substrate and the first transistor, the intervening layer also between the substrate and the second transistor, wherein the intervening layer includes silicon germanium (SiGe).

Example 11 includes the subject matter of Example 10, wherein at least a portion of the SiGe included in the intervening layer is relaxed and thereby includes no stress.

Example 12 includes the subject matter of Example 10 or 11, wherein the SiGe included in the intervening layer includes a germanium (Ge) concentration in the range of 20-80 percent.

Example 13 includes the subject matter of any of Examples 10-12, wherein the intervening layer includes a thickness between the substrate and the first transistor of at least 20 nanometers (nm).

Example 14 includes the subject matter of any of Examples 1-13, wherein at least one of the first and second channel regions includes a finned configuration.

Example 15 includes the subject matter of any of Examples 1-14, wherein at least one of the first and second channel regions includes a nanowire configuration.

Example 16 includes the subject matter of any of Examples 1-15, further including a complementary metal-oxide-semiconductor (CMOS) circuit including the first and second transistors.

Example 17 is a computing system including the subject matter of any of Examples 1-16.

Example 18 is an integrated circuit (IC) including: a substrate; a first transistor above the substrate and including a first gate, a first channel region below the first gate and including tensile-strained semiconductor material, and first source and drain (S/D) regions adjacent the first channel region; and a second transistor above the substrate and including a second gate, a second channel region below the second gate and including compressive-strained semiconductor material, and second source and drain (S/D) regions adjacent the second channel region; wherein the compressive-strained semiconductor material includes at least 40 percent more germanium (Ge) content by atomic percentage than the tensile-strained semiconductor material.

Example 19 includes the subject matter of Example 18, wherein the first transistor is an n-channel metal-oxide-semiconductor field-effect transistor (n-MOS) device and wherein the second transistor is a p-channel metal-oxide-semiconductor field-effect transistor (p-MOS) device.

Example 20 includes the subject matter of Example 18 or 19, wherein the wherein the compressive-strained semiconductor material includes at least 60 percent more germanium (Ge) content by atomic percentage than the tensile-strained semiconductor material.

Example 21 includes the subject matter of any of Examples 18-20, wherein the tensile-strained semiconductor material includes silicon (Si).

Example 22 includes the subject matter of any of Examples 18-20, wherein the tensile-strained semiconductor material includes silicon germanium (SiGe).

Example 23 includes the subject matter of any of Examples 18-22, wherein the compressive-strained semiconductor material includes silicon germanium (SiGe).

Example 24 includes the subject matter of any of Examples 18-22, wherein the compressive-strained semiconductor material includes germanium (Ge).

Example 25 includes the subject matter of any of Examples 18-24, wherein the compressive-strained semiconductor material includes at least 1 gigapascal (GPa) of compressive stress.

Example 26 includes the subject matter of any of Examples 18-25, wherein the tensile-strained semiconductor material includes at least 1 gigapascal (GPa) of tensile stress.

Example 27 includes the subject matter of any of Examples 18-26, further including an intervening layer between the substrate and the first transistor, the intervening layer also between the substrate and the second transistor, wherein the intervening layer includes silicon germanium (SiGe).

Example 28 includes the subject matter of Example 27, wherein at least a portion of the SiGe included in the intervening layer is relaxed and thereby includes no stress.

Example 29 includes the subject matter of Example 27 or 28, wherein the SiGe included in the intervening layer includes a germanium (Ge) concentration in the range of 20-80 percent.

Example 30 includes the subject matter of any of Examples 27-29, wherein the intervening layer includes a thickness between the substrate and the first transistor of at least 20 nanometers (nm).

Example 31 includes the subject matter of any of Examples 18-30, wherein at least one of the first and second channel regions includes a finned configuration.

Example 32 includes the subject matter of any of Examples 18-31, wherein at least one of the first and second channel regions includes a nanowire configuration.

Example 33 includes the subject matter of any of Examples 18-32, further including a complementary metal-oxide-semiconductor (CMOS) circuit including the first and second transistors.

Example 34 is a computing system including the subject matter of any of Examples 18-33.

Example 35 is a method of forming an integrated circuit (IC), the method including: providing a substrate; forming a first transistor above the substrate, the first transistor including a first gate, a first channel region below the first gate and including tensile-strained semiconductor material, and first source and drain (S/D) regions adjacent the first channel region and including n-type doped semiconductor material; and forming a second transistor above the substrate, the second transistor including a second gate, a second channel region below the second gate and including compressive-strained semiconductor material, and second S/D regions adjacent the second channel region and including p-type doped semiconductor material.

Example 36 includes the subject matter of Example 35, wherein at least one of the first and second channel regions is formed using a replacement fin scheme that includes removing original fins to form fin-shaped trenches and forming the at least one of the first and second channel regions in the fin-shaped trenches.

Example 37 includes the subject matter of Example 35 or 36, wherein at least one of the first and second channel regions is formed from a blanket-grown layer.

Example 38 includes the subject matter of any of Examples 35-37, further including forming a silicon germanium (SiGe) buffer layer prior to forming the first and second transistors, wherein the SiGe buffer layer is between the substrate and the first transistor and wherein the SiGe buffer layer is also between the substrate and the second transistor.

Example 39 includes the subject matter of Example 38, wherein the first and second channel regions are on the SiGe buffer layer.

Example 40 includes the subject matter of Example 38 or 39, wherein the tensile-strained semiconductor material includes a relatively lower Ge concentration by atomic percentage than the SiGe buffer layer Ge concentration.

Example 41 includes the subject matter of any of Examples 38-40, wherein the compressive-strained semiconductor material includes a relatively higher Ge concentration by atomic percentage than the SiGe buffer layer Ge concentration.

Example 42 includes the subject matter of any of Examples 35-41, further including forming a complementary metal-oxide-semiconductor (CMOS) circuit including the first and second transistors.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
   a substrate;

a structure above the substrate, the structure comprising silicon and germanium;
a first transistor above the structure, the first transistor including
a first gate,
a first semiconductor region at least below the first gate and including tensile-strained semiconductor material, the first semiconductor region in direct contact with the structure, and
first source and drain (S/D) regions laterally adjacent the first semiconductor region and including n-type doped semiconductor material; and
a second transistor above the structure, the second transistor including
a second gate,
a second semiconductor region at least below the second gate and including compressive-strained semiconductor material, the second semiconductor region in direct contact with the structure, and
second source and drain (S/D) regions laterally adjacent the second semiconductor region and including p-type doped semiconductor material.

2. The IC of claim 1, wherein the compressive-strained semiconductor material includes at least 40 percent more germanium (Ge) content by atomic percentage than the tensile-strained semiconductor material.

3. The IC of claim 1, wherein the compressive-strained semiconductor material includes at least 60 percent more germanium (Ge) content by atomic percentage than the tensile-strained semiconductor material.

4. The IC of claim 1, wherein the tensile-strained semiconductor material includes silicon (Si).

5. The IC of claim 1, wherein the tensile-strained semiconductor material includes silicon and germanium (SiGe).

6. The IC of claim 1, wherein the compressive-strained semiconductor material includes silicon and germanium (SiGe).

7. The IC of claim 1, wherein the compressive-strained semiconductor material includes germanium (Ge).

8. The IC of claim 1, wherein the compressive-strained semiconductor material includes at least 0.5 gigapascals (GPa) of compressive stress, and/or wherein the tensile-strained semiconductor material includes at least 0.5 gigapascals (GPa) of tensile stress.

9. The IC of claim 1, wherein the structure is a continuous layer that is in direct contact with both the first semiconductor region and the second semiconductor region.

10. The IC of claim 9, wherein the structure comprising silicon and germanium is relaxed and thereby includes no stress.

11. The IC of claim 9, wherein the structure comprises a germanium (Ge) concentration in the range of 20-80 percent.

12. The IC of claim 1, wherein at least one of the first and second semiconductor regions includes a finned configuration.

13. The IC of claim 1, wherein at least one of the first and second semiconductor regions includes a nanowire configuration.

14. The IC of claim 1, further comprising a complementary metal-oxide-semiconductor (CMOS) circuit including the first and second transistors.

15. An integrated circuit (IC) comprising:
a substrate;
a first transistor above the substrate and including
a first gate,
a first semiconductor region at least below the first gate and including tensile-strained semiconductor material, wherein the first semiconductor region is in direct contact with a first region comprising germanium, the first region compositionally different from the first semiconductor region, the first region disposed between the first semiconductor region and the substrate; and
first source and drain (S/D) regions laterally adjacent the first semiconductor region; and
a second transistor above the substrate and including
a second gate,
a second semiconductor region at least below the second gate and including compressive-strained semiconductor material, wherein the second semiconductor region is in direct contact with a second region comprising germanium, the second region compositionally different from the second semiconductor region, the second region disposed between the second semiconductor region and the substrate, and
second source and drain (S/D) regions laterally adjacent the second semiconductor region;
wherein the compressive-strained semiconductor material includes at least 40 percent more germanium (Ge) content by atomic percentage than the tensile-strained semiconductor material.

16. The IC of claim 15, wherein the first transistor is an n-channel metal-oxide-semiconductor field-effect transistor (n-MOS) device and wherein the second transistor is a p-channel metal-oxide-semiconductor field-effect transistor (p-MOS) device.

17. The IC of claim 15, wherein the wherein the compressive-strained semiconductor material includes at least 60 percent more germanium (Ge) content by atomic percentage than the tensile-strained semiconductor material.

18. The IC of claim 15, wherein the first region and the second region is part of a continuous region that comprises germanium and silicon.

19. An integrated circuit (IC) comprising:
first and second sub-fins, each of the first and second sub-fins comprising silicon and germanium (SiGe);
a first transistor above the first sub-fin and including
a first gate structure, and
a first semiconductor region below the first gate structure and between first and second portions of the first gate structure, the first semiconductor region in direct contact with the first sub-fin and including tensile-strained semiconductor material; and
a second transistor above the second sub-fin and including
a second gate structure, and
a second semiconductor region below the second gate structure and between first and second portions of the second gate structure, the second semiconductor region in direct contact with the second sub-fin and including compressive-strained semiconductor material;
wherein the tensile-strained semiconductor material includes no germanium (Ge) or less germanium (Ge) content by atomic percentage than the first sub-fin, and the compressive-strained semiconductor material includes more germanium (Ge) content by atomic percentage than the second sub-fin.

20. The IC of claim 19, further comprising first source and drain (S/D) regions laterally adjacent the first semiconductor region, and second source and drain (S/D) regions laterally adjacent the second semiconductor region,
wherein the first transistor is an n-channel metal-oxide-semiconductor field-effect transistor (n-MOS) device, and the second transistor is a p-channel metal-oxide-semiconductor field-effect transistor (p-MOS) device.

* * * * *